(12) United States Patent
Lai

(10) Patent No.: US 6,692,283 B1
(45) Date of Patent: Feb. 17, 2004

(54) ZERO INSERTION/EXTRACTION FORCE INTEGRATED CIRCUIT SOCKET

(76) Inventor: Kuang-Chih Lai, No. 2, Lane 10, Sheng-Li Street, Tu-Cheng City, Taipei Hsien (TW)

( * ) Notice: Subject to any disclaimer, the term of this patent is extended or adjusted under 35 U.S.C. 154(b) by 0 days.

(21) Appl. No.: 10/361,764

(22) Filed: Feb. 11, 2003

(51) Int. Cl.⁷ .................................................. H10R 4/50
(52) U.S. Cl. ...................................................... 439/342
(58) Field of Search ................................. 439/342, 264, 439/268, 259, 265, 263, 266

(56) References Cited

U.S. PATENT DOCUMENTS

| | | | |
|---|---|---|---|
| 5,387,121 A | | 2/1995 | Kurz |
| 5,456,613 A | | 10/1995 | McHugh |
| 6,059,596 A | | 5/2000 | Pei |
| 6,146,178 A | * | 11/2000 | Walkup et al. ............... 439/342 |
| 6,203,350 B1 | * | 3/2001 | Walkup et al. ............... 439/342 |
| 6,231,366 B1 | * | 5/2001 | Pei et al. ..................... 439/342 |
| 6,296,506 B1 | * | 10/2001 | Mizumura et al. .......... 439/342 |
| 6,338,639 B1 | * | 1/2002 | Trout et al. .................. 439/342 |
| 6,338,646 B1 | * | 1/2002 | Hara et al. ................... 439/488 |
| 6,368,139 B1 | * | 4/2002 | Ohkita et al. ................ 439/342 |
| 6,383,007 B1 | | 5/2002 | Lin |
| 6,431,900 B1 | * | 8/2002 | Yu ................................ 439/342 |
| 6,450,825 B1 | * | 9/2002 | Huang ......................... 439/342 |
| 6,450,827 B1 | * | 9/2002 | Huang et al. ............... 439/342 |
| 6,619,974 B1 | * | 9/2003 | Hou et al. .................... 439/342 |

* cited by examiner

*Primary Examiner*—Ross Gushi
*Assistant Examiner*—Phuongchi Nguyen
(74) *Attorney, Agent, or Firm*—Rosenberg, Klein & Lee

(57) ABSTRACT

A zero insertion/extraction force integrated circuit socket including an insulating socket one side of which is formed with a receiving dent. A slide cover is slidably connected with the insulating socket and a corresponding side of which is formed with a U-shaped dent. A driving member having a driving cam is pivotally disposed in the receiving dent and U-shaped dent. The rotational axis of the driving member is normal to the sliding direction of the slide cover and parallel to a slide connecting face of the insulating socket. The slide cover is formed with a perforation and the driving member has an insertion dent corresponding to the perforation. An operating piece can be inserted into the insertion dent to drive the driving member, whereby the driving cam contacts with the U-shaped dent to drive the slide cover to slide between a separation position and a contact position.

11 Claims, 27 Drawing Sheets

ZERO INSERTION/EXTRACTION FORCE INTEGRATED CIRCUIT SOCKET

BACKGROUND OF THE INVENTION

1. Field of the Invention

The present invention is related to a zero insertion/extraction force integrated circuit socket, and more particularly to a driving structure of the socket for driving a slide cover to slide along the insulating socket.

2. Description of the Prior Arts

Zero insertion/extraction force integrated circuit socket is for an integrated circuit such as a central processor unit (CPU) to insert therein with nearly zero force. After inserted, the CPU is electrically connected with the main board of a computer. When it is necessary to upgrade the computer, the CPU is extracted from the socket with nearly zero force to replace the CPU with an upgraded product.

In order to achieve the object of zero insertion/extraction force, a slide cover is added to the bottommost insulating socket. The slide cover is slidable along the insulating socket. The multiple insertion pins of the CPU are passed through the slide cover and then inserted into the insulating socket. However, after inserted, the insertion pins do not directly contact with the multiple conductive members inlaid in the insulating socket so that the insertion force is nearly zero. Then, by means of a driving structure disposed between the insulating socket and the slide cover, the slide cover is driven and slided to simultaneously make the insertion pins of the CPU slide into the contact sections of the conductive members and respectively electrically contact with the conducting members.

When extracting the CPU, the driving structure is operated to force the slide cover to slide in a reverse direction, whereby the insertion pins of the CPU are simultaneously detached from the conductive members. Thereafter, the CPU can be easily extracted. It is known from the above that the driving structure plays a very important role in the operation.

There are various types of driving structures which will be respectively described as follows:

U.S. Pat. Nos. 5,387,121 and 5,456,613 disclose a first earliest and typical driving structure. An L-shaped operation lever is clamped on one side of the zero insertion/extraction force (zero insertion force) integrated circuit socket. A driving section positioned between the insulating socket and the slide cover is manufactured as a cam. An operating section of the operation lever is exposed to outer side of the socket. The operating section is pinched by fingers to turn the driving section for driving the slide cover to slide.

The first type of driving section has a shortcoming. That is, the operating section extends out of the socket for a user's fingers to pinch. Accordingly, a considerable operating space must be reserved beside the operating section. This makes the layout of the space quite limited and fails to meet the requirement of thinness and lightness.

U.S. Pat. Nos. 6,059,596 and 6,383,007 disclose a second type of driving structure for solving the problem existing in the first type of driving structure. Two opposite sides of one side of the insulating socket is formed with a dent. A tool such as a flat head screwdriver can be inserted into the dent which serves as a fulcrum of the screwdriver. The screwdriver can swing back and forth to push the slide cover to slide back and forth. By this measure, it is unnecessary to reserve an operating space in the socket. However, this driving structure has a shortcoming, that is, the sliding distance of the slide cover can be hardly accurately controlled. As a result, the insertion pins of the CPU often fail to fully contact with the conductive members of the insulating socket or over-contact with the conductive members to damage the conductive members.

U.S. Pat. Nos. 6,231,366 and 6,338,646 disclose a third type of a driving structure to solve the above problems existing in the first and second types of driving structures. A driving cam is rotatably disposed on one side of the zero insertion/extraction force integrated circuit socket. The rotational axis of the driving cam is normal to the surface of the slide cover. A flat head or hexagonal screwdriver is inserted into a straight or hexagonal recess of top end of the driving cam in a direction normal to the surface of the slide cover. The screwdriver is turned to drive and rotate the cam which drives the slide cover to slide back and forth. By means of this measure, the sliding distance of the slide cover can be accurately controlled.

However, this driving structure has a shortcoming, that is, it costs much strength to turn the screwdriver. The radius of the handle of the screwdriver much smaller than the length of the operating section of the L-shaped operation lever of the first driving structure. For example, the length of the operating section may be several times the radius of the handle of the screwdriver. Therefore, the force necessary for turning the screwdriver is much greater than the force necessary for shifting the operating section.

SUMMARY OF THE INVENTION

It is therefore a primary object of the present invention to provide a zero insertion/extraction force integrated circuit socket which can overcome the problem existing in the first type of conventional driving structure, that is, the operating section extends out of the socket for a user's fingers to pinch. Accordingly, a considerable operating space must be reserved beside the operating section. This makes the layout of the space quite limited and fails to meet the requirement of thinness and lightness.

It is a further object of the present invention to provide the above zero insertion/extraction force integrated circuit socket which can overcome the problem existing in the second type of conventional driving structure, that is, the sliding distance of the slide cover can be hardly accurately controlled. As a result, the insertion pins of the CPU often fail to fully contact with the conductive members of the insulating socket or over-contact with the conductive members to damage the insertion pins and the conductive members.

It is still a further object of the present invention to provide the above zero insertion/extraction force integrated circuit socket which can overcome the problem existing in the third type of conventional driving structure, that is, it costs much strength to turn the screwdriver.

It is still a further object of the present invention to provide the above zero insertion/extraction force integrated circuit socket by which a user can use a screwdriver to very easily and accurately slide the slide cover.

It is still a further object of the present invention to provide the above zero insertion/extraction force integrated circuit socket by which the slide cover can be stably kept in the contact position or totally close position.

It is still a further object of the present invention to provide the above zero insertion/extraction force integrated circuit socket by which the occupied space is reduced and the material is saved.

It is still a further object of the present invention to provide the above zero insertion/extraction force integrated circuit socket by which a user can feel the engagement when the slide cover reaches both the contact position and separation position. Therefore, the user can ensure that the slide cover be moved to a desired position.

According to the above objects, the zero insertion/extraction force integrated circuit socket of the present invention includes an insulating socket, multiple conductive members and a slide cover.

The insulating socket has: a first slide connecting face positioned on one face of the insulating socket; multiple insertion holes arranged on the first slide connecting face and passing through the insulating socket; a first receiving section formed on one side of the insulating socket and having a receiving dent communicating with the first slide connecting face; and two first guiding edges respectively disposed on two opposite edges of the insulating socket, each of the guiding edges having a first latch section projecting therefrom. The conductive members are inserted in the insertion holes of the insulating socket one pair by one pair. The conductive members pass through the insertion holes to electrically contact with a circuit board. The slide cover has: a second slide connecting face positioned on one face of the slide cover to sidably contact with the first slide connecting face of the insulating socket, a direction in which the slide cover moves relative to the insulating socket being defined as sliding direction; multiple through holes arranged on the second slide connecting face of the slide cover and passing through the slide cover, multiple insertion pins of an integrated circuit being inserted through the through holes into the insertion holes of the insulating socket; a second receiving section formed on one side of the slide cover, the second receiving section having a U-shaped dent communicating with the second slide connecting face and a perforation passing through the second receiving section to communicate with the U-shaped dent, the second receiving section and the first receiving section of the insulating socket being mated with each other to together form a receiving cavity; and two second guiding edges respectively disposed on two opposite edges of the slide cover, each guiding edge having a second latch section, the second latch section being slidably latched with the first latch section of the insulating socket, whereby the first and second guiding edges and the first and second slide connecting faces together guide the slide cover to slide relative to the insulating socket. The driving member is entirely hidden and pivotally disposed in the receiving cavity composed of the first receiving section of the insulating socket and the second receiving sections of the slide cover.

The driving member has: a first stop face positioned on one side of the driving member, the driving member being pivotally rotatable to a position where the first stop face contacts with the receiving dent of the insulating socket and stops, this position being defined as a first position; a second stop face positioned on the other side of the driving member, the driving member being pivotally rotatable to a position where the second stop face contacts with the receiving dent of the insulating socket and stops, this position being defined as a second position; a driving cam slidably contacting with the U-shaped dent of the slide cover; and an insertion dent exposed to the perforation of the second receiving section of the slide cover, whereby an operating piece can be inserted from the perforation of the slide cover into the insertion dent of the driving member to drive the driving member, the driving cam of the driving member being pivotally rotatable to the first position to drive the slide cover, whereby the slide cover is guided to slide to a contact position where the insertion pins of the integrated circuit totally contact with the conductive members, when the driving cam of the driving member is pivotally rotated to the second position, the slide cover being driven to slide from the contact position to a separation position where the insertion pins of the integrated circuit totally separate from the conductive members.

The driving member is received in the receiving cavity of the insulating socket and pivotally rotatable therein. The receiving cavity has two U-shaped pivot recesses respectively formed at two ends of the receiving cavity to communicate with the first slide connecting face. A connecting line of the semicircular centers of the two U-shaped pivot recesses is defined as a first axis, the first axis being normal to said sliding direction and parallel to the first slide connecting face of the insulating socket.

The U-shaped dent of the slide cover has: two slide channels respectively formed at two ends of the U-shaped dent and communicate with the second slide connecting face, the two slide channels respectively corresponding to the two u-shaped pivot recesses of the insulating socket, the two slide channels and the two U-shaped pivot recesses together forming two pivot cavities at two ends of the receiving cavity; a first driven face formed on one side of the U-shaped dent of the slide cover between the U-shaped dent and the through hole; and two second driven faces formed on the other side of the U-shaped dent of the slide cover respectively corresponding to two ends of the first driven face, a distance between the second driven face and the first driven face being defined as a first width.

The slide cover further includes a projecting section projecting from the second slide connecting face. The projecting section is positioned between the U-shaped dent and the through hole and adjacent to one side of the U-shaped dent. The first driven face extends to one lateral face of the projecting section, the other lateral face of the projecting section serving as a first stop face.

The insulating socket further has a dent formed on the insulating socket between the receiving cavity and the insertion hole. The dent is also adjacent to and communicates with one side of the receiving cavity. The dent communicates with the first slide connecting face and corresponds to the projecting section for receiving the projecting section. A face of the dent corresponding to the first stop face of the projecting section serves as a second stop face, whereby when the slide cover reaches the contact position, the first stop face contacts with the second stop face.

The driving cam of the driving member has: a first cam section having a first cam edge formed on one side of the first cam section, the first cam edge slidably contacting with the first driven face of the slide cover, whereby the first cam edge can drive the first driven face of the slide cover to make the slide cover slide to the contact position; and two second cam sections formed at two ends of the first cam section, each second cam section having a second cam edge, the two second cam edges respectively simultaneously contacting with the two second driven faces of the slide cover, whereby the second cam sections can synchronously drive the two second driven faces of the slide cover to make the slide cover slide to the separation position, a maximum width between the second cam edge and the first cam edge being defined as a second width.

The driving member further has two pivot shafts respectively formed at two ends of the driving member and positioned at rear ends of the two second cam sections. A connecting line of the centers of the pivot shafts is defined as a second axis. The two pivot shafts are pivotally disposed in the two pivot dents composed of two U-shaped pivot recesses of the insulating socket and two slide channels of the slide cover. The second axis coincides with the first axis of the insulating socket.

The first cam section further has an arched face radially positioned between the first cam edge and the insertion dent. The arched face is immediately adjacent to the first cam edge. An axis of the curvature center of the arched face coincides with the second axis of the driving member, whereby the radia from every parts of the arched face to the second axis are equal and the radia from every parts of the arched face to the second axis are all not smaller than the radia from any part of the first cam edge to the second axis. An adjoining section between the first cam edge and the arched face just contacts with the first driven face of the slide cover in a position which is defined as a contact travel ending position, whereby when the driving member reaches the contact travel ending position, the slide cover just reaches the contact position, while the first stop face of the driving member has not yet reached the first position, whereby in the travel of the driving member from the contact travel ending position to the first position, the arched face succeeds the first cam edge to continuously contact with the first driven face of the slide cover. The radia from the arched face to the second axis are equal so that the slide cover always stably keeps in the contact position.

The first cam edge is formed with a protruding arched shape. The slide cover further has a locating section formed on the first driven face. The position of the locating section is a position where the first cam edge contacts with the first driven face when the driving member reaches the second position. The second width is larger than the first width, whereby the first cam edge can latch with the locating section to stably keep the driving member in the second position and thus stably keep the slide cover in the separation position.

The driving cam of the driving member further includes a third cam edge formed on the other side of the first cam section. The third cam edge contacts with the third driven face of the slide cover. A connecting line of the first cam edge and the second as and a connecting line of the third cam edge and the second axis contain an angle defined as a first angle.

A connecting line of the first cam edge and the second axis and the connecting line of the second cam edge and the second axis contain an angle defined as a second angle. The first angle is larger than the second angle, whereby the third cam edge first drives the third driven face of the slide cover and pushes the slide cover from the contact position to the separation position as a first stage of separation travel. Then the second cam edge successively drives the second driven face of the slide cover and continuously pushes the slide cover to the separation position as a second state of separation travel.

The present invention can be best understood through the following description and accompanying drawings wherein:

DETAILED DESCRIPTION OF THE PREFERRED EMBODIMENT

Figure 1:
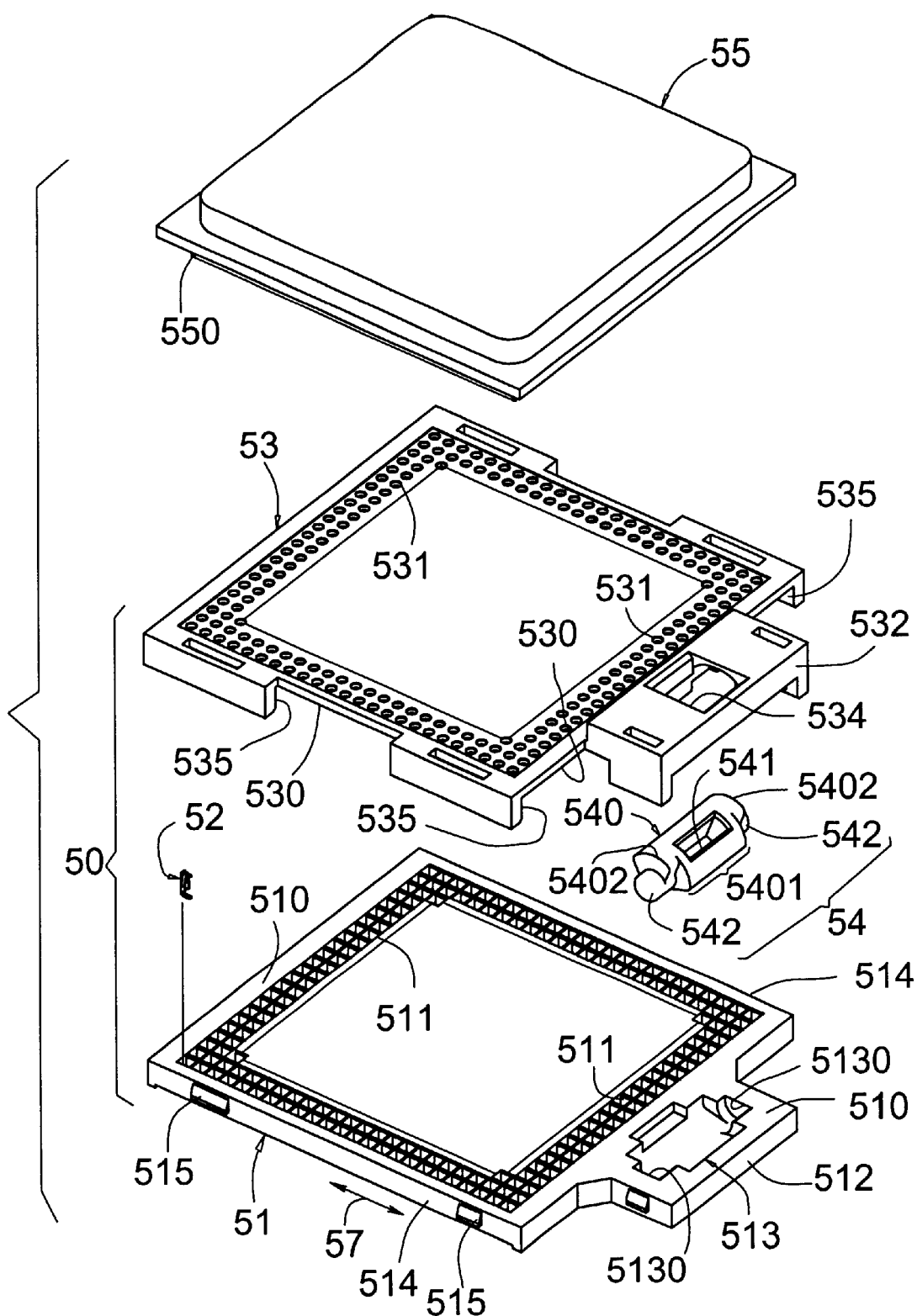
FIG. 1 is a perspective exploded view of the present invention.
Figure 2:
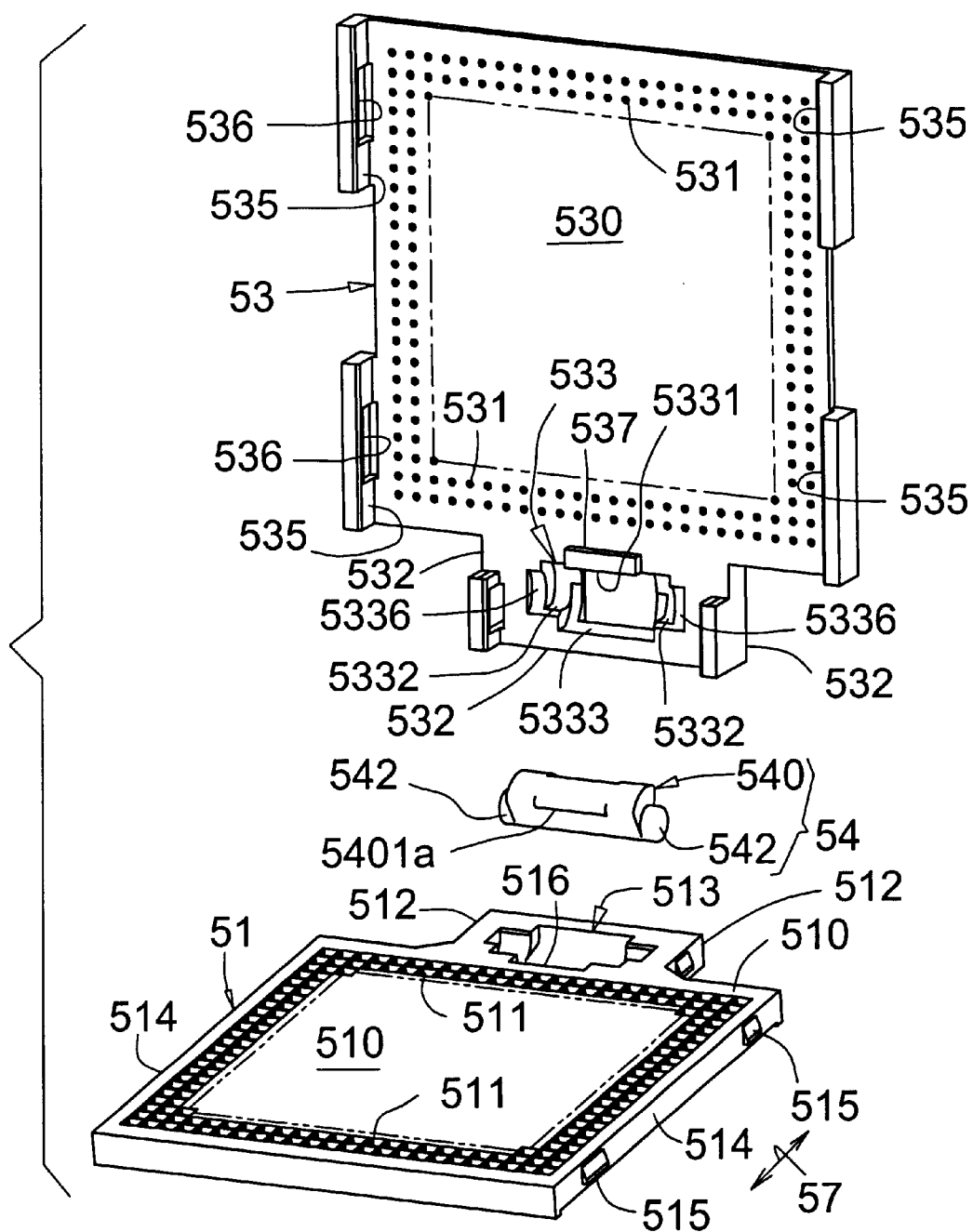
FIG. 2 is a perspective exploded view of the present invention, in which the slide cover is turned upward.
Figure 3:
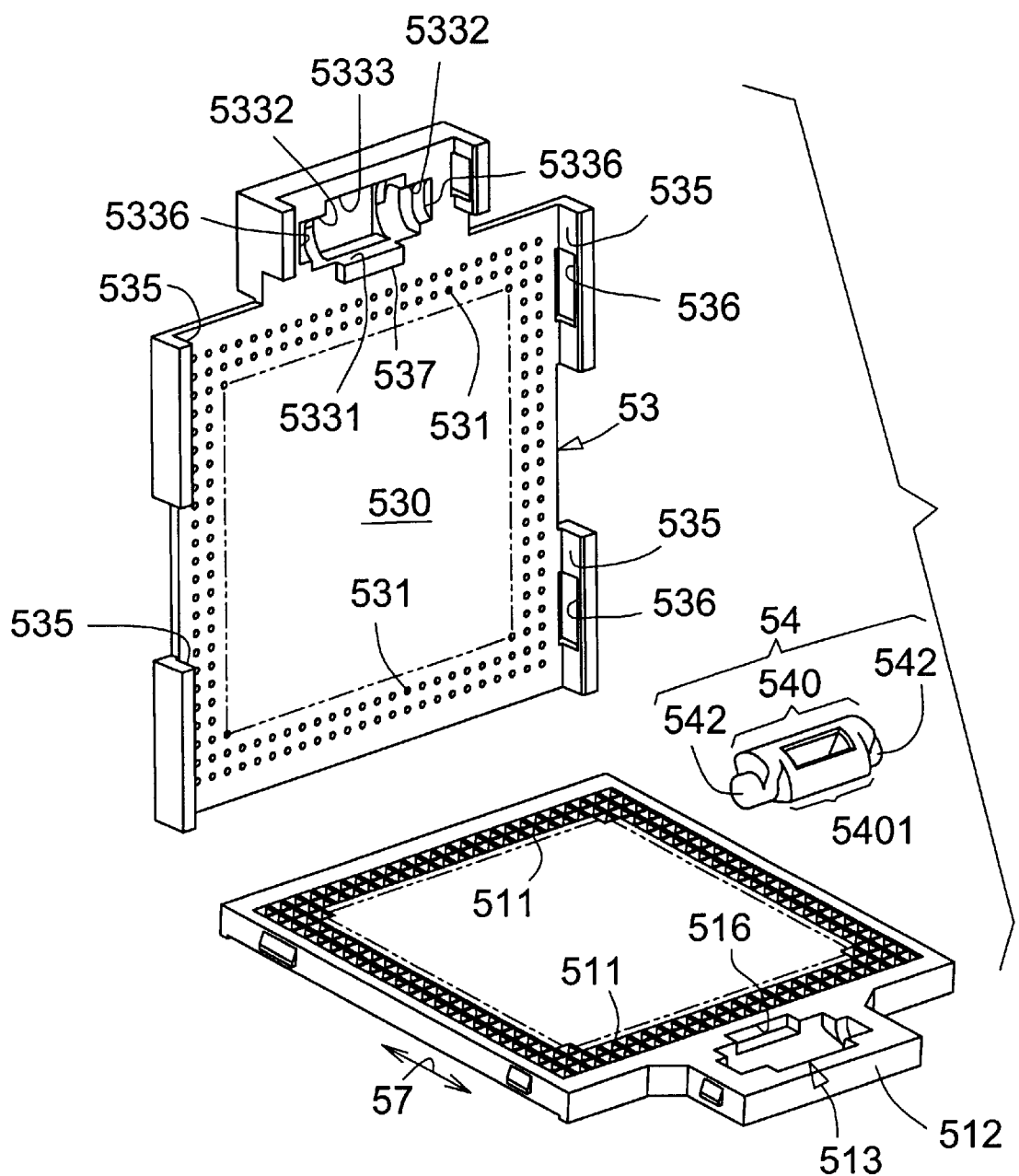
FIG. 3 is a perspective exploded view of the present invention, in which the slide cover is turned upward.
Figure 4:
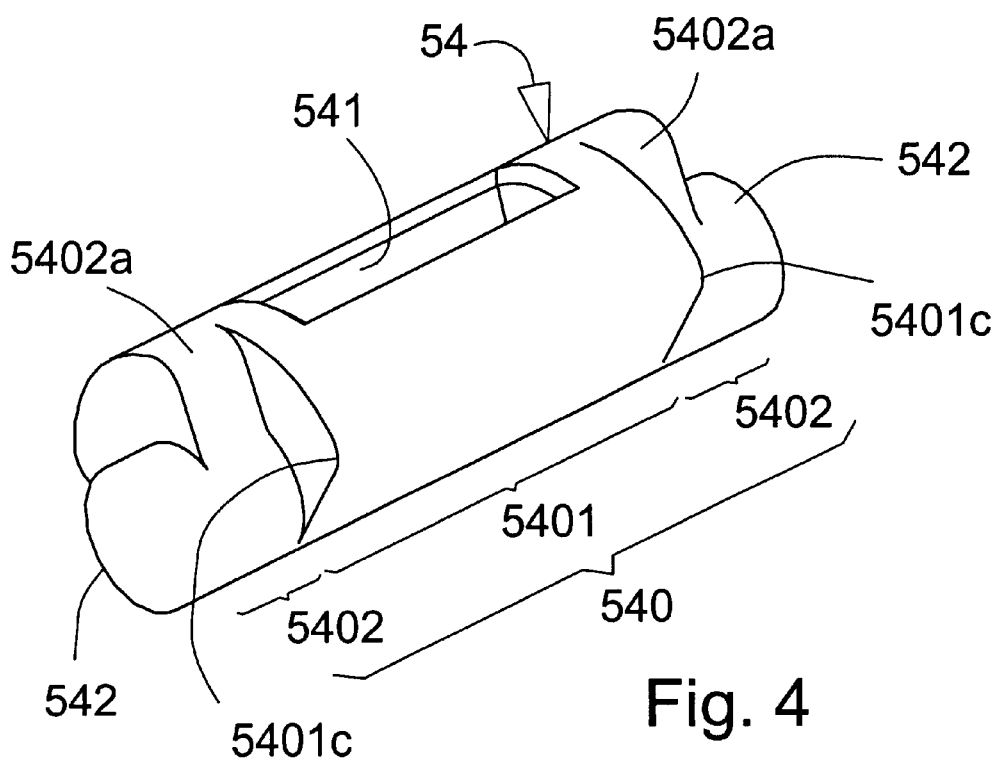
FIG. 4 is a perspective view of the driving member of the present invention, showing one side thereof.
Figure 5:
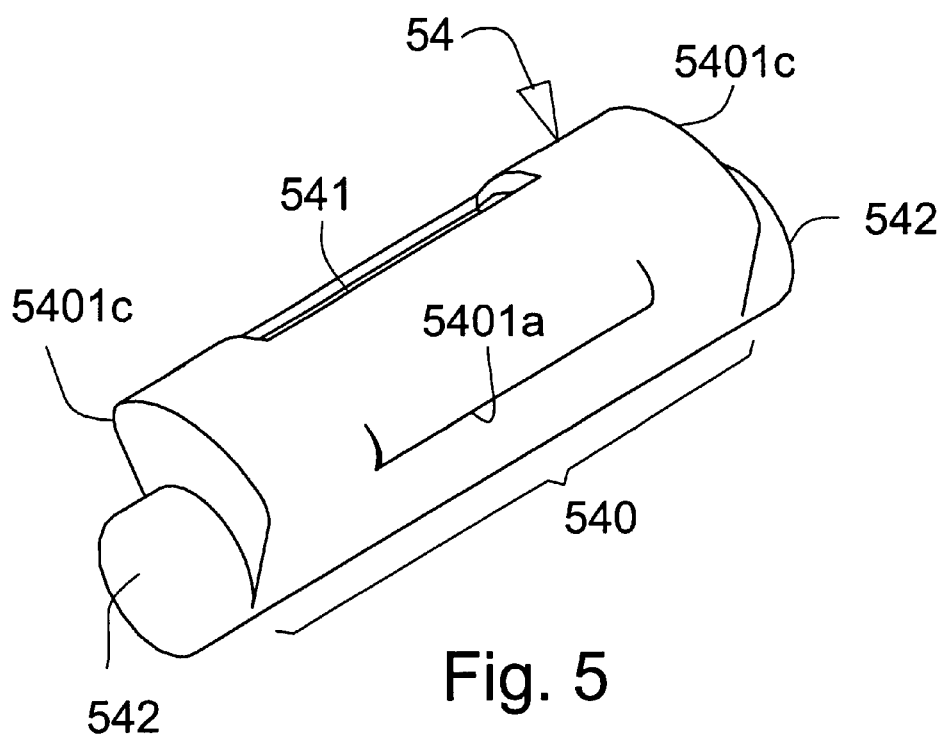
FIG. 5 is a perspective view of the driving member of the present invention, showing the other side thereof.
Figure 6:
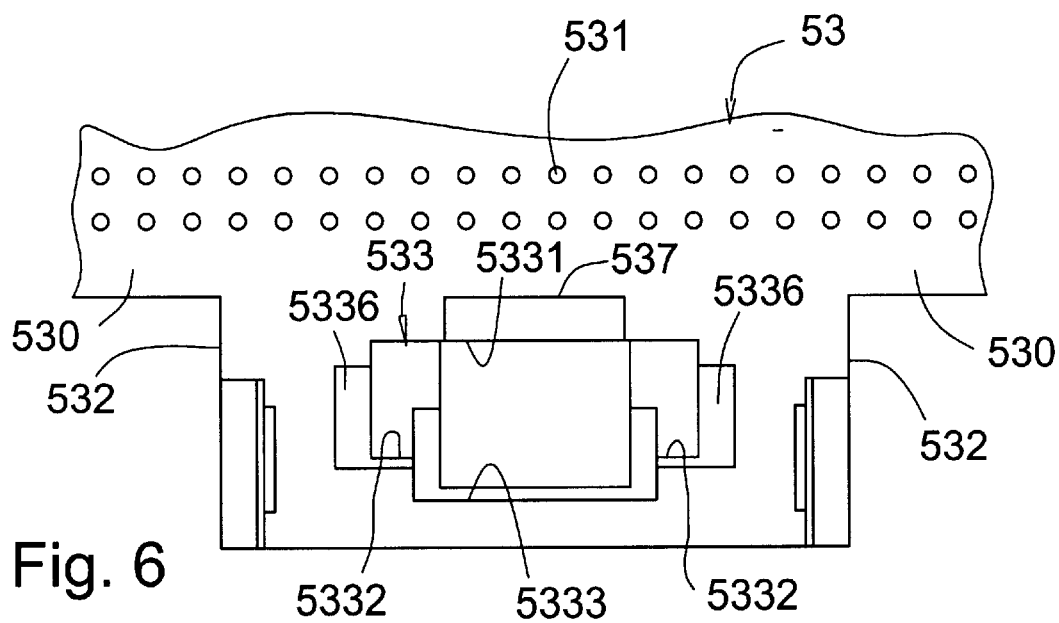
FIG. 6 is a partially bottom view of the slide cover of the present invention, in which the integrated circuit is inserted into the socket.
Figure 7:
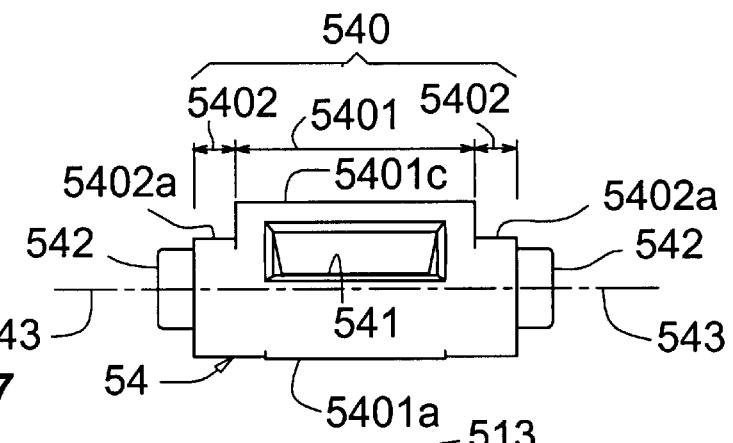
FIG. 7 is a top view of the driving member of the present invention.
Figure 8:
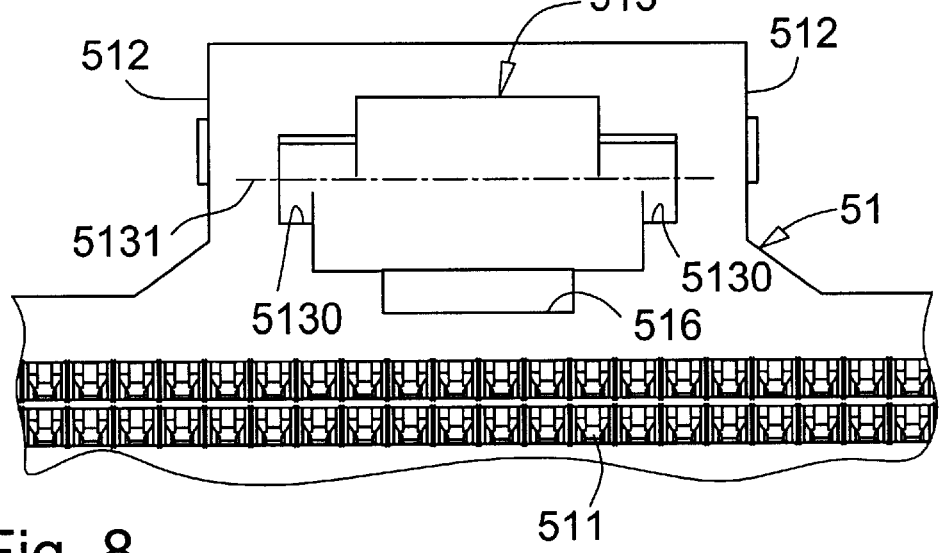
FIG. 8 is a partially top view of the insulating socket of the present invention.
Figure 9:
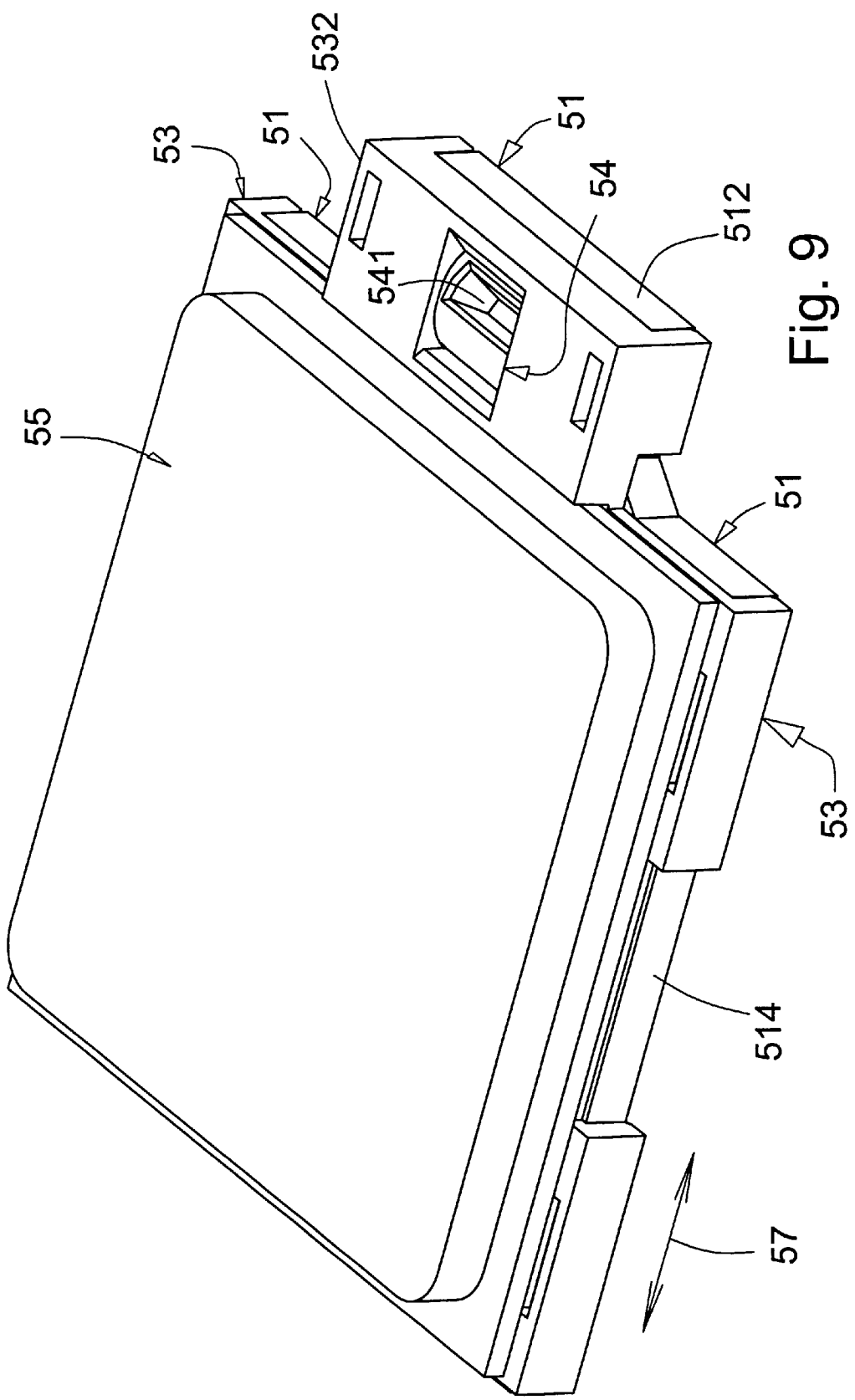
FIG. 9 is a perspective assembled view of the entire socket of the present invention.
Figure 10:
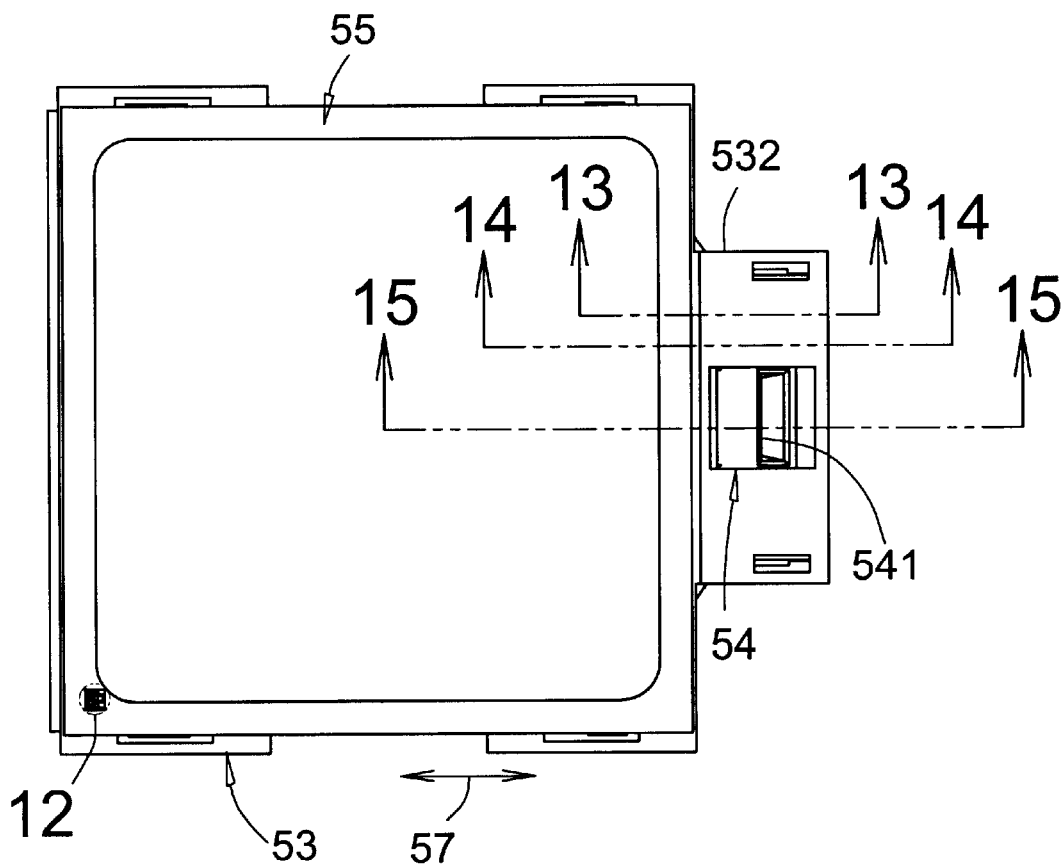
FIG. 10 is a top assembled view of the entire socket of the present invention.
Figure 11:
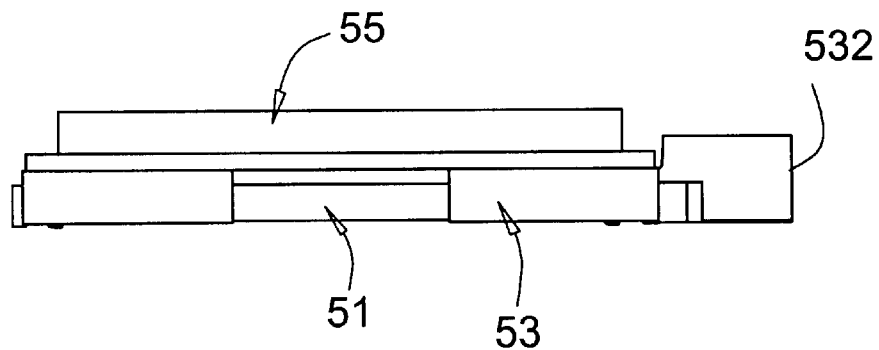
FIG. 11 is a right view of the entire socket of the present invention.

Please refer to FIGS. 1, 2, 3, 8, 9, 13, 14, 15, 16, 17 and 18. The zero insertion/extraction force integrated circuit socket 50 of the present invention includes an insulating socket 51 multiple conductive members 52 and a slide cover 53. The insulating socket 51 has a first slide connecting face 510, multiple insertion holes 511, a first receiving section 512 and two guiding edges 514. The first slide connecting face 510 is positioned on one face of the insulating socket 51. The multiple insertion holes 511 are arranged on the first slide connecting face 510 and pass through the insulating socket 51. The first receiving section 512 is formed on one side of the insulating socket 51 and has a receiving dent 513 communicating with the first slide connecting face 510. The two first guiding edges 514 are respectively disposed on two opposite edges of the insulating socket 51. Each of the guiding edges 514 has a first latch section 515 projecting therefrom.

Figure 12:
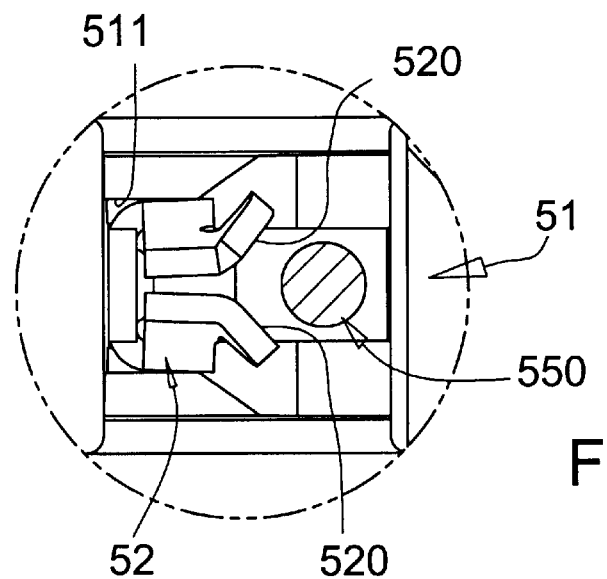
FIG. 12 is an enlarged view of circled area 12 of FIG. 10, showing that the insertion pins of the integrated circuit are positioned in separation position and totally detached from the conductive members.
Figure 13:
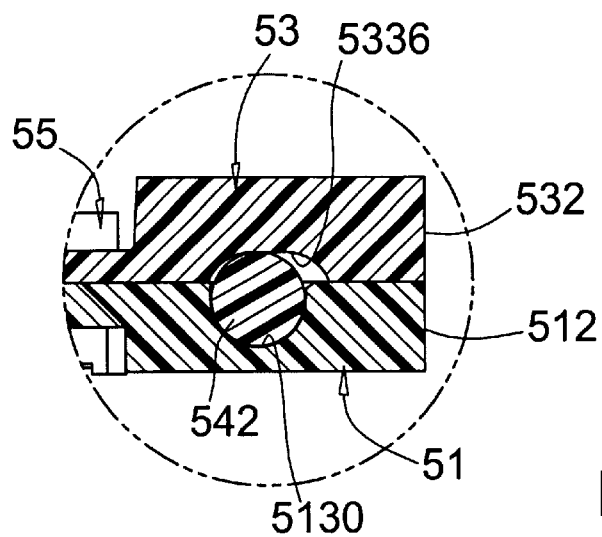
FIG. 13 is a partially sectional view taken along line 13—13 of FIG. 10.
Figure 14:
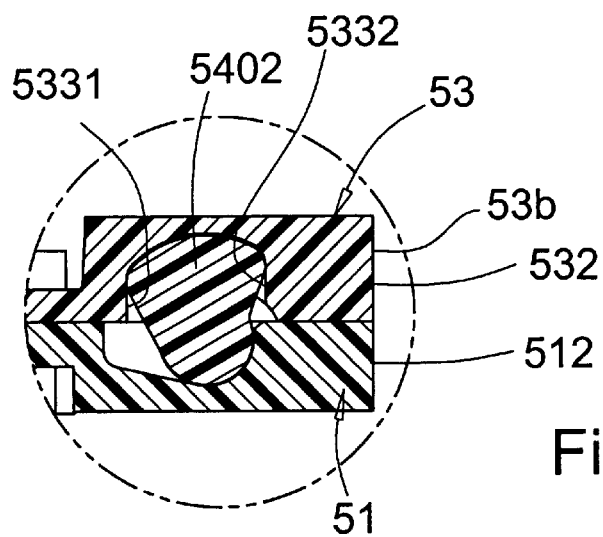
FIG. 14 is a partially sectional view taken along line 14—14 of FIG. 10.
Figure 15:
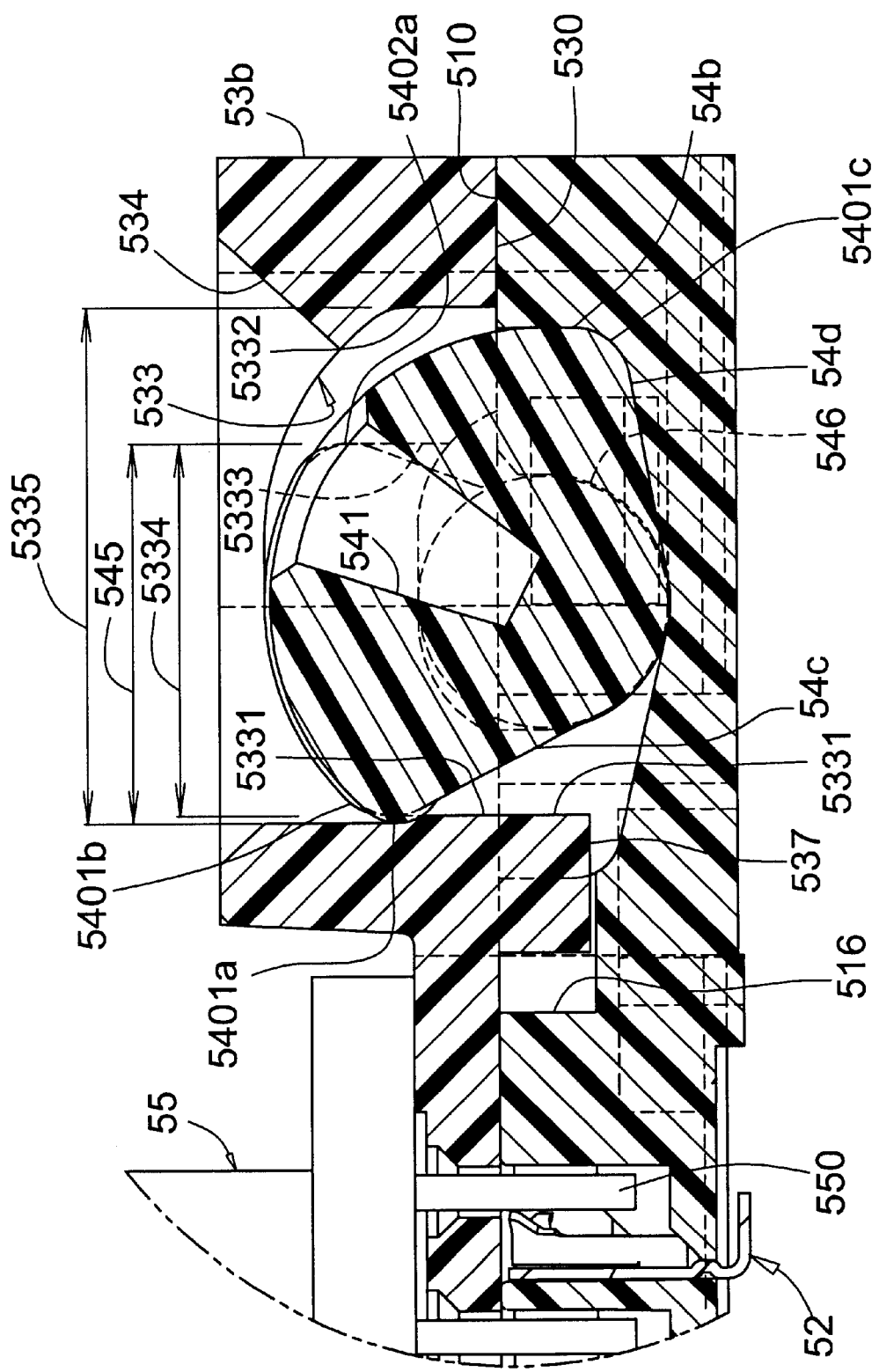
FIG. 15 is a partially sectional enlarged view taken along line 15—15 of FIG. 10.
Figure 16:
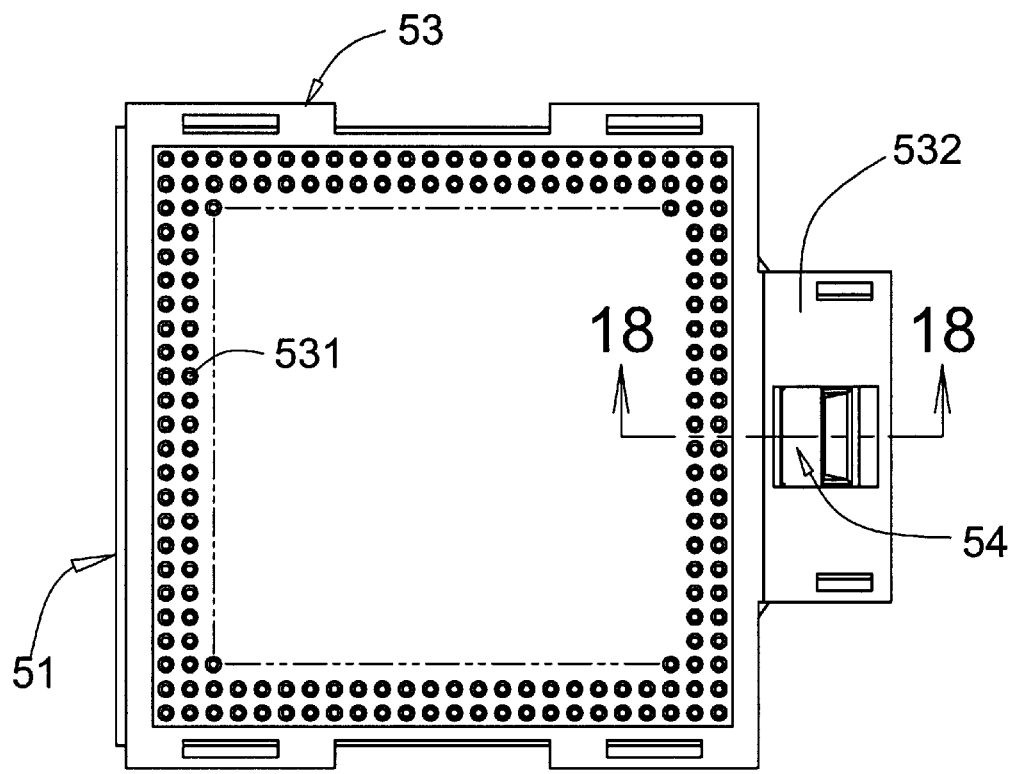
FIG. 16 is a top view of the entire socket of the present invention, in which the integrated circuit is not inserted in the socket.
Figure 17:
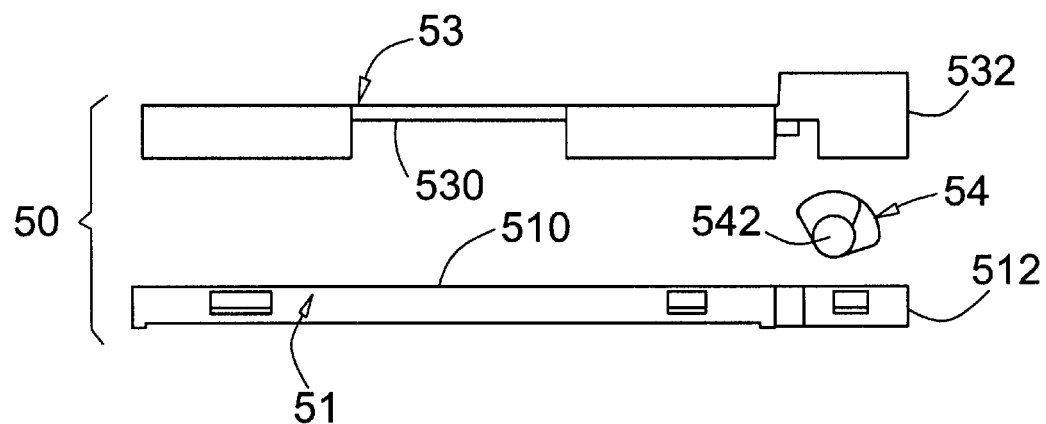
FIG. 17 is a right view according to FIG. 16, showing that the socket of the present invention is exploded.

Referring to FIGS. 1, 12 and 15, the conductive members 52 are inserted in the insertion holes 511 of the insulating socket 51 one pair by one pair. The conductive members 52 pass through the insertion holes 511 to electrically contact with the circuit board. Each conductive member 52 has two resilient sections 520. The insertion pin 550 of the integrated circuit 55 can be slided into the gap between the two resilient sections 520 to electrically contact with the conductive member 52.

Referring to FIGS. 1, 2, 3, 6, 9, 12, 13, 14, 15, 16, 17 and 18, the slide cover 53 has a second slide connecting face 530, multiple through holes 531, a second receiving section 532 and two second guiding edges 535. The second slide connecting face 530 is positioned on one face of the slide cover 53 to slidably contact with the first slide connecting face 510 of the insulating socket 51. The direction in which the slide cover 53 moves relative to the insulating socket 51 is defined as sliding direction 57.

Referring to FIGS. 1, 2, 3, 6, 9 and 15, the multiple through holes 531 are arranged on the second slide connecting face 530 of the slide cover 53 and pass through the slide cover 53. Multiple insertion pins 550 of an integrated circuit 55 are inserted through the through holes 531 into the insertion holes 511 of the insulating socket 51. The second receiving section 532 is formed on one side of the slide cover and has a U-shaped dent 533 communicating with the second slide connecting face 530 and a perforation 534 passing through the second receiving section 532 to communicate with the U-shaped dent 533. The second receiving section 52 and the first receiving section of the insulating socket 51 are mated with each other to together form a receiving cavity.

Referring to FIGS. 1, 2, 3, 9, 17 and 18, the two second guiding edges 535 are respectively disposed on two opposite edges of the slide cover 53. Each guiding edge 535 has a second latch section 536. The second latch section 536 is slidably latched with the first latch section 515 of the insulating socket 51. Accordingly, the first and second guiding edges 514, 535 and the first and second slide connecting faces 510, 530 together guide the slide cover 53 to slide relative to the insulating socket 51.

Referring to FIGS. 1, 2, 3, 4, 7, 9, 15, 17 and 18, the driving member 54 is entirely hidden and pivotally disposed in the receiving cavity composed of the first receiving section 512 of the insulating socket 51 and the second receiving sections 532 of the slide cover 53. The driving member 54 has a first stop face 54c, a second stop face 54c, a driving cam 540 and an insertion dent 541.

Figure 33:
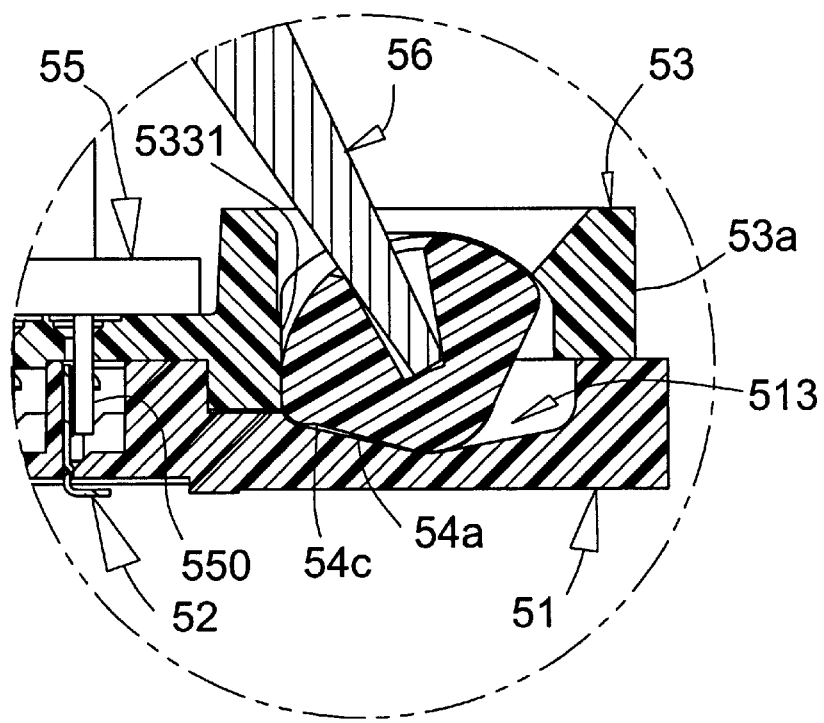
FIG. 33 is a partially sectional view taken along line 33—33 of FIG. 29.

Referring to FIGS. 1 to 9, 15, 17 and 18, the first stop face 54c is positioned on one side of the driving member 54. The driving member 54 can be pivotally rotated to a position where the first stop face 54c contacts with the receiving dent 513 of the insulating socket 51 and stops. This position is defined as a first position 54a as shown in FIG. 33.

Referring to FIGS. 1 to 9, 15, 17 and 18, the second stop face 54d is positioned on the other side of the driving member 54. The driving member 54 can be pivotally rotated to a position where the second stop face 54d contacts with the receiving dent 513 of the insulating socket 51 and stops. This position is defined as a second position 54b as shown in FIG. 15.

Figure 46:
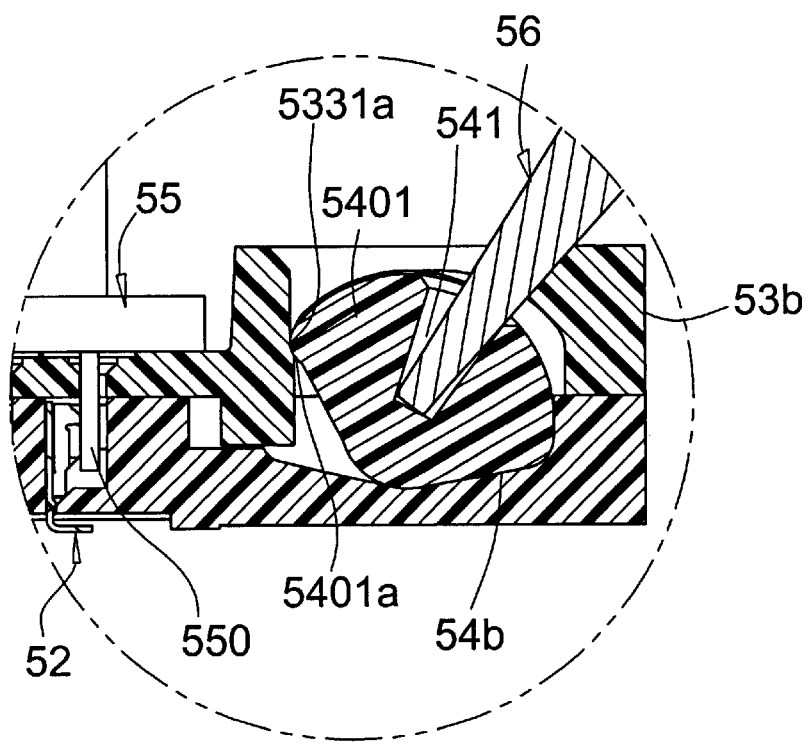
FIG. 46 is a partially sectional view taken along line 46—46 of FIG. 42.

Referring to FIGS. 1 to 9, 15, 17 and 18, the driving cam 540 slidably contacts with the U-shaped dent 533 of the slide cover 53. The insertion dent 541 is exposed to the perforation 534 of the second receiving section 532 of the slide cover 53. An operating piece 56 can be inserted from the perforation 534 of the slide cover 53 into the insertion dent 541 of the driving member 54 to drive the driving member 54. The driving cam 540 of the driving member 54 is pivotally rotated to the first position 54a (as shown in FIG. 33) to drive the slide cover 53, whereby the slide cover 53 is guided to slide to a contact position 53a where the insertion pins 550 of the integrated circuit 55 totally contact with the conductive members 52 (as shown in FIG. 33). When the driving cam 540 of the driving member 54 is pivotally rotated to the second position 54b (as shown in FIG. 46), the slide cover 53 is driven to slide from the contact position 53a to a separation position 53b where the insertion pins 550 of the integrated circuit 55 totally separate from the conductive members 52.

Referring to FIGS. 1, 2, 3, 8, 13, 15, 17 and 18, the driving member 54 is received in the receiving cavity 513 of the insulating socket 51 and pivotally rotatable therein. The receiving cavity 513 has two U-shaped pivot recesses 5130 respectively formed at two ends of the receiving cavity 513 to communicate with the first slide connecting face 510. The connecting line of the semicircular centers of the two U-shaped pivot recesses 5130 is defined as a first axis 5131. The first axis 5131 is normal to the aforesaid sliding direction 57 and parallel to the first slide connecting face 510 of the insulating socket 51.

Referring to FIGS. 1, 2, 3, 6, 15, 17 and 18, the U-shaped dent 533 of the slide cover 53 has two slide channels 5336, a first driven face 5331 and two second driven faces 5332.

Referring to FIGS. 2, 3, 6, 8, 13, 15 and 18, the two slide channels 5336 are respectively formed at two ends of the U-shaped dent 533 and communicate with the second slide connecting face 530. The two slide channels 5336 respectively correspond to the two u-shaped pivot recesses 5132 of the insulating socket 51. The two slide channels 5336 and the two U-shaped pivot recesses 5132 together form two pivot cavities at two ends of the receiving cavity.

Referring to FIGS. 2, 3, 6, 15 and 18, the first driven face 5331 is formed on one side of the U-shaped dent 533 of the slide cover 51 between the U-shaped dent 533 and the through hole 531.

Referring to FIGS. 2, 3, 6, 15 and 18, the two second driven faces 5332 are formed on the other side of the U-shaped dent 533 of the slide cover 51 respectively corresponding to two ends of the first driven face 5331. The distance between the second driven face 5332 and the first driven face 5311 is defined as a first width 5334.

Referring to FIGS. 2, 3, 6, 15 and 18, the slide cover 53 further includes a projecting section 537 projecting from the second slide connecting face 530. The projecting section 537 is positioned between the U-shaped dent 533 and the through hole 531 and adjacent to one side of the U-shaped dent 533. The first driven face 5331 extends to one lateral face of the projecting section 537. The other lateral face of the projecting section 537 serves as a first stop face 5370.

Referring to FIGS. 1, 2, 3, 6, 8, 15 and 18, the insulating socket 51 further has a dent 516 formed on the insulating socket 51 between the receiving cavity 513 and the insertion hole 511. In addition, the dent 516 is adjacent to and communicates with one side of the receiving cavity 513. The dent 516 communicates with the first slide connecting face 510 and corresponds to the projecting section 537 for receiving the projecting section 537. A face of the dent 516 corresponds to the first stop face 5370 of the projecting section 537 serves as a second stop face 5160. When the slide cover 53 reaches the contact position, the first stop face 5370 contacts with the second stop face 5160.

Referring to FIGS. 1 to 8, 15, 17 and 18, the driving cam 540 of the driving member 54 has a first cam section 5401 and two second cam sections 5402. The first cam section 5401 has a first cam edge 5401a formed on one side of the first cam section 5401. The first cam edge 5401a slidably contacts with the first driven face 5331 of the slide cover 53, whereby the first cam edge 5401a can drive the first driven face 5331 of the slide cover 53 to make the slide cover 53 slide to the contact position.

Referring to FIGS. 1 to 8, 15, 17 and 18, the two second cam sections 5402 are formed at two ends of the first cam section 5401. Each second cam section 5402 has a second cam edge 5402a. The two second cam edges 5402a respectively simultaneously contact with the two second driven faces 5332 of the slide cover 53, whereby the second cam sections 5402 can synchronously drive the two second driven faces 5332 of the slide cover 53 to make the slide cover 53 slide to the separation position. The maximum width between the second cam edge 5402a and the first cam edge 5401a is defined as a second width 545.

Referring to FIGS. 1 to 9, 13, 15, 17 and 18, the driving member 54 further has two pivot shafts 542 respectively formed at two ends of the driving member 54 and positioned at rear ends of the two second cam sections 5402. The connecting line of the centers of the pivot shafts 542 is defined as a second axis 543. The two pivot shafts 542 are pivotally disposed in the two pivot dents composed of two U-shaped pivot recesses 5132 of the insulating socket 51 and two slide channels 5336 of the slide cover 53. In addition, the second axis 543 coincides with the first axis 5131 of the insulating socket 51.

Referring to FIGS. 4 to 8, 15 and 18, the first cam section 5401 further has an arched face 5401b radially positioned between the first cam edge 5401a and the insertion dent 541. The arched face 5401b is immediately adjacent to the first cam edge 5401a. The axis of the curvature center of the arched face 5401b coincides with the second axis 543 of the driving member 54, whereby the radia from every parts of the arched face 5401b to the second axis 543 are equal and the radia from every parts of the arched face 5401b to the second axis 543 are all not smaller than the radia from any part of the first cam edge 5401a to the second axis 543. The adjoining section between the first cam edge 5401a and the arched face 5401b just contacts with the first driven face 5331 of the slide cover 53 in a position which is defined as a contact travel ending position. When the driving member 54 reaches the contact travel ending position, the slide cover 54 just reaches the contact position, while the first stop face 54c of the driving member 54 has not yet reached the first position 54a. Accordingly, in the travel of the driving member 54 from the contact travel ending position to the first position 54a, the arched face 5401b succeeds the first cam edge 5401a to continuously contact with the first driven face 5331 of the slide cover 53. The radia from the arched face 5401b to the second axis 543 are equal so that the slide cover 54 always stably keeps in the contact position.

Referring to FIGS. 1 to 8, 15, 17, 18 and 23, the first cam edge 5401a is formed with a protruding arched shape. The slide cover 53 further has a locating section 533 1a formed on the first driven face 5331. The position of the locating section 5331a is a position where the first cam edge 5401a contacts with the first driven face 5331 when the driving member 54 reaches the second position 54b. The second width 545 is larger than the first width 5334, whereby the first cam edge 5401a can latch with the locating section 5331a to stably keep the driving member 54 in the second position 54b and thus stably keep the slide cover 54 in the separation position 53b.

Referring to FIGS. 1 to 8, 15, 17 and 18, the driving cam 540 of the driving member 54 further includes a third cam edge 5401c formed on the other side of the first cam section 5401. The third cam edge 5401c contacts with the third driven face 5333 of the slide cover 53. The connecting line of the first cam edge 5401a and the second axis 543 and the connecting line of the third cam edge 5401c and the second axis 543 contain an angle defined as a first angle 5403.

Figure 18:
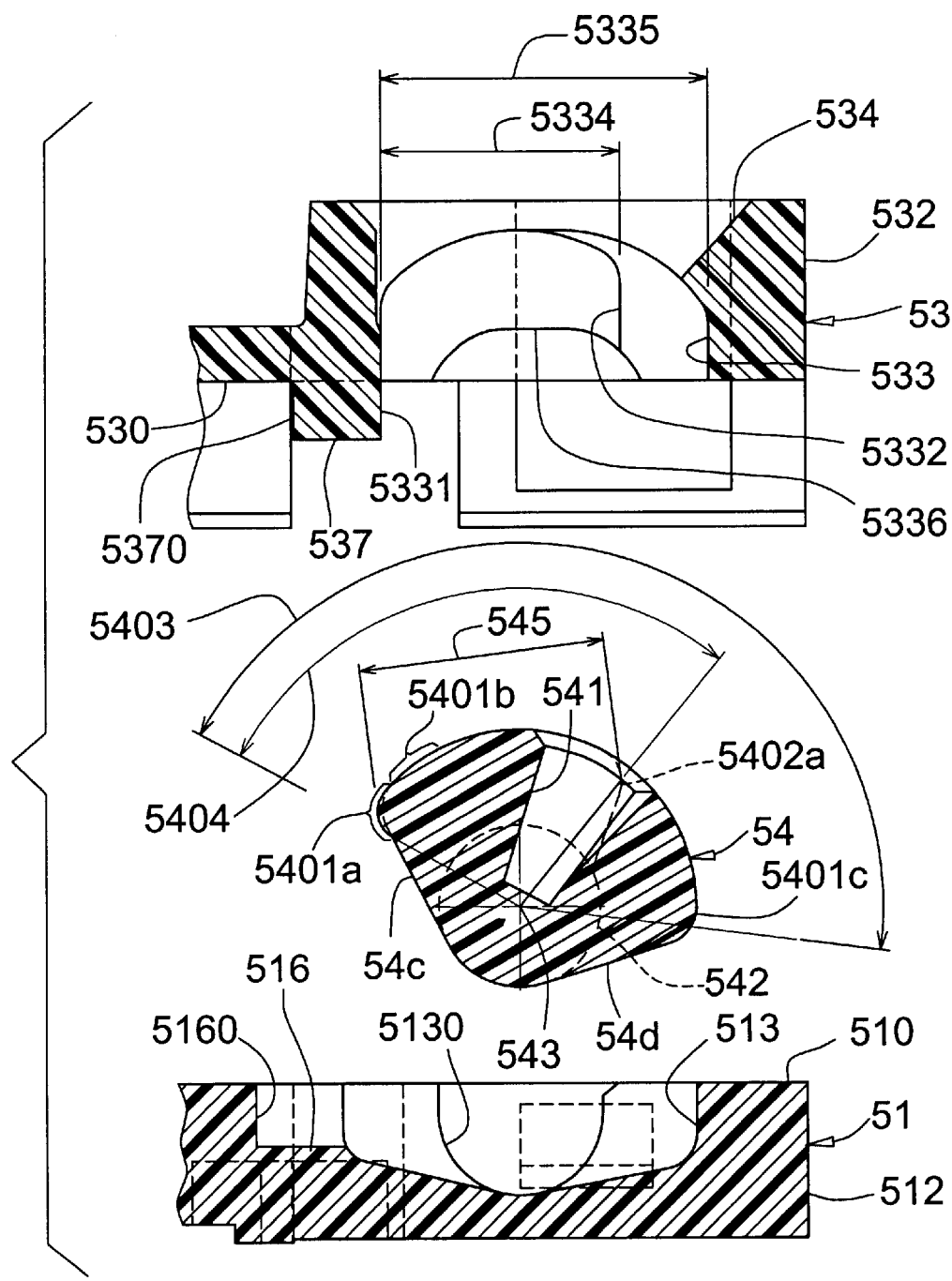
FIG. 18 is a partially sectional enlarged view taken along line 18—18 of FIG. 16.

Referring to FIG. 18, the connecting line of the first cam edge 5401a and the second axis 543 and the connecting line of the second cam edge 5402a and the second axis 543 contain an angle defined as a second angle 5404. The first angle 5403 is larger than the second angle 5404, whereby the third cam edge 5401c first drives the third driven face 5333 of the slide cover 53 and pushes the slide cover 53 from the contact position to the separation position as a first stage of separation travel. Then the second cam edge 5402a successively drives the second driven face 5332 of the slide cover 53 and continuously pushes the slide cover 53 to the separation position as a second state of separation travel.

In operation, as shown in FIGS. 1 and 9 to 14, the leftmost side of the slide cover 54 is aligned with the rightmost side of the insulating socket 51, whereby the slide cover 54 is positioned in the rightmost separation position. The multiple insertion pins 550 of the integrated circuit 55 are first passed through the through holes 531 of the slide cover 54 and inserted into the insertion holes 511 of the insulating socket 51 (as shown in FIG. 12).

Figure 19:
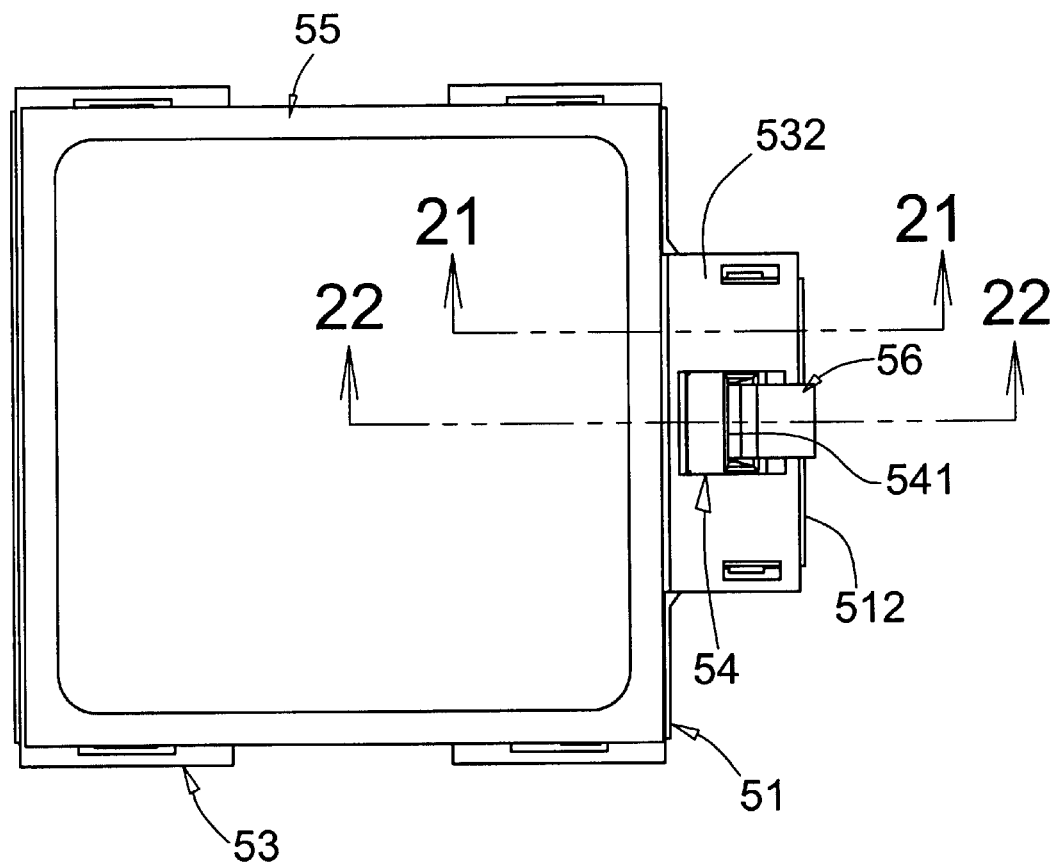
FIG. 19 is a top assembled view of the entire socket of the present invention, showing that an operating piece such as a screwdriver has been inserted into the insertion dent of the driving member to start leftward shifting the screwdriver.
Figure 20:
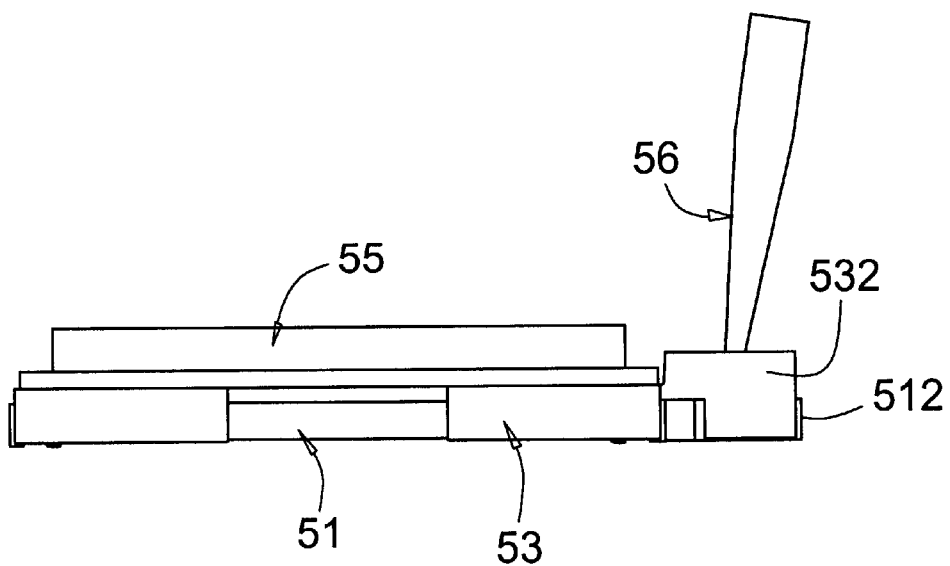
FIG. 20 is a right view of the entire socket of the present invention.
Figure 21:
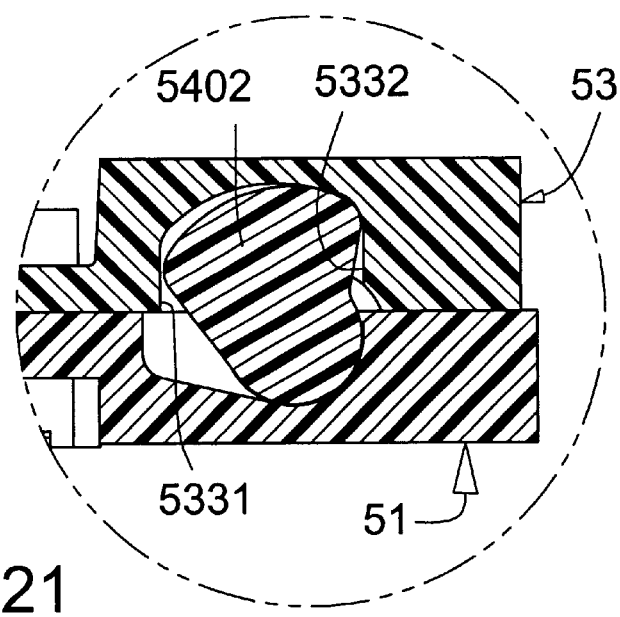
FIG. 21 is a partially sectional view taken along line 21—21 of FIG. 19.
Figure 22:
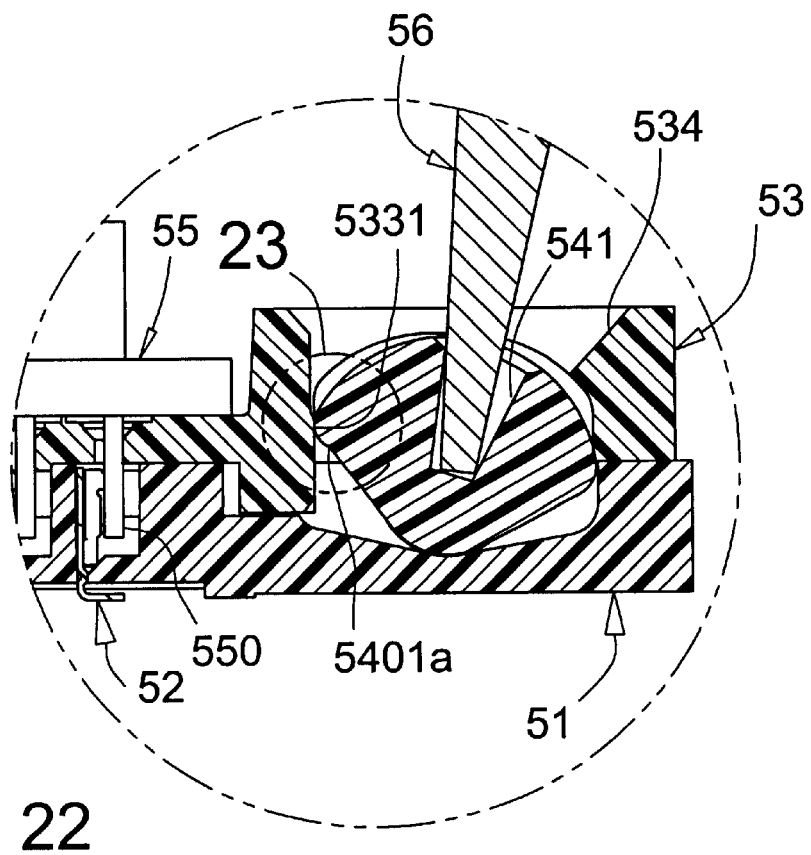
FIG. 22 is a partially sectional view taken along line 22—22 of FIG. 19.
Figure 23:
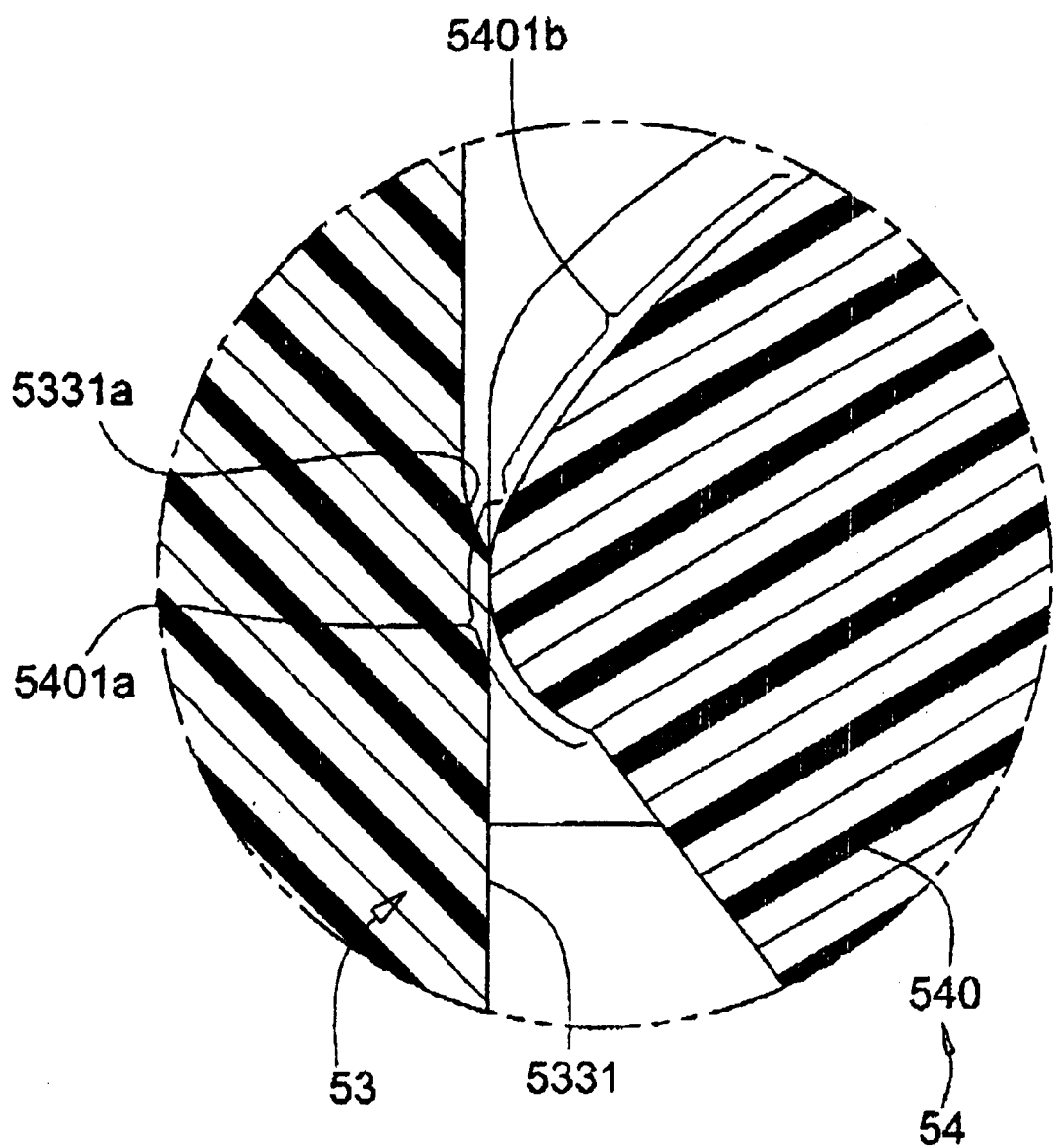
FIG. 23 is an enlarged view of circled area 23 of FIG. 22.
Figure 24:
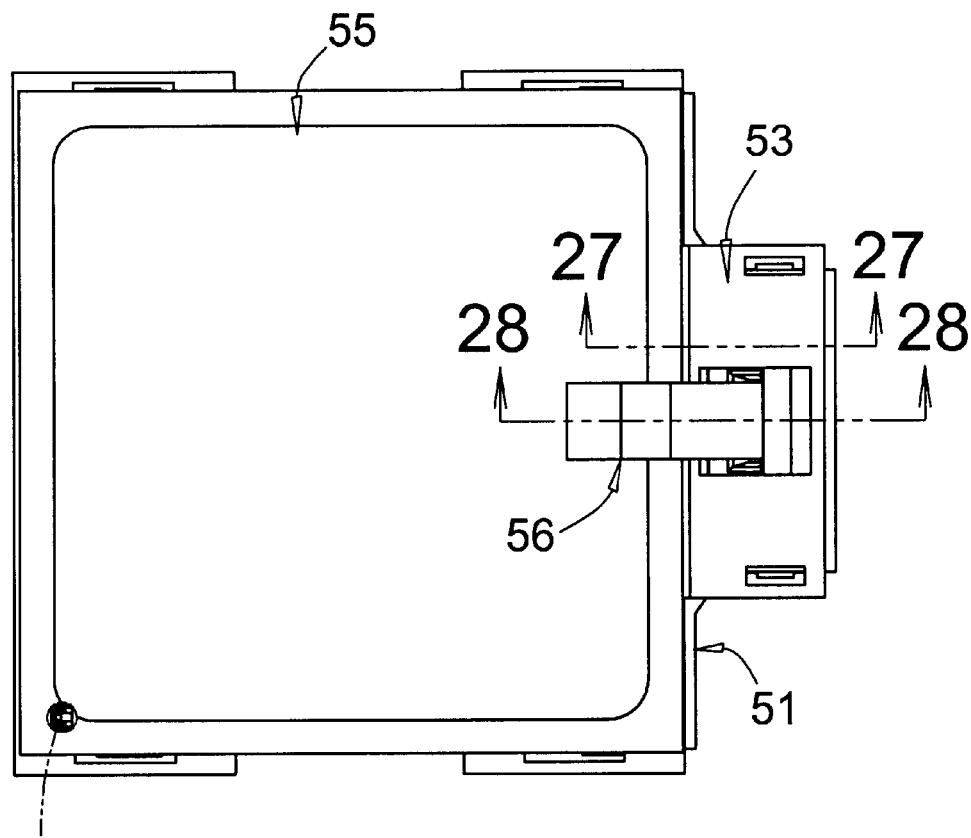
FIG. 24 is a top assembled view of the entire socket of the present invention, showing that an operating piece such as a screwdriver is further leftward shifted to counterclockwise rotate the driving member to about reach the leftmost first position and at this time, the slide cover has slid to the leftmost contact position.
Figure 25:
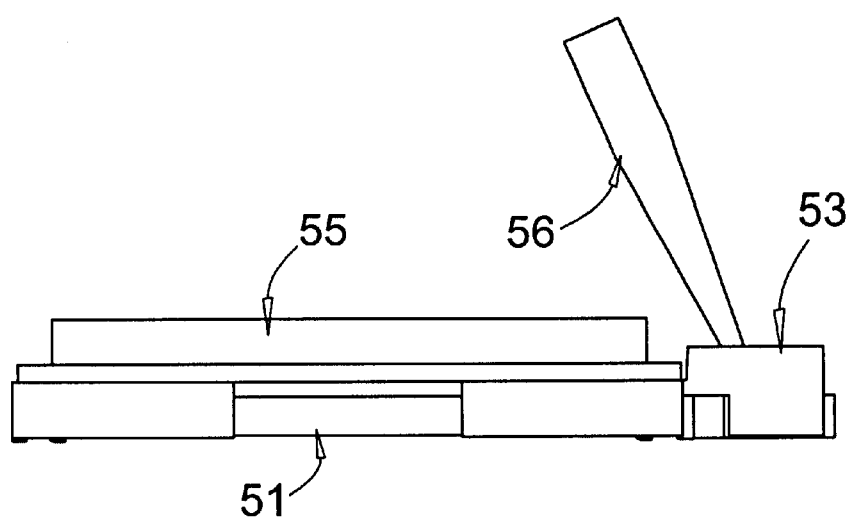
FIG. 25 is a right view of the entire socket of the present invention.
Figure 26:
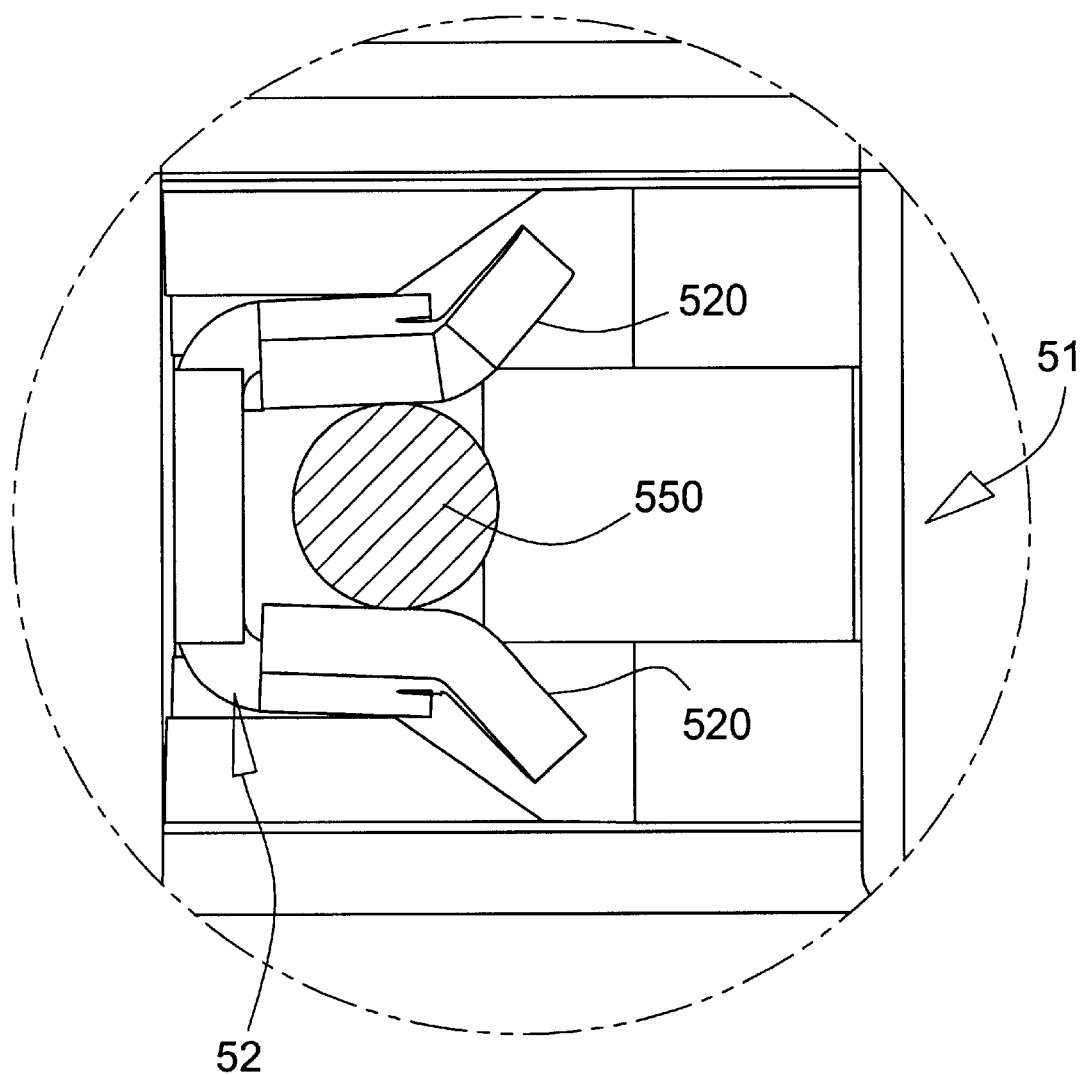
FIG. 26 is an enlarged view of circled area 26 of FIG. 24, showing that the insertion pins of the integrated circuit have reached the contact position to totally contact with the conductive members.
Figure 27:
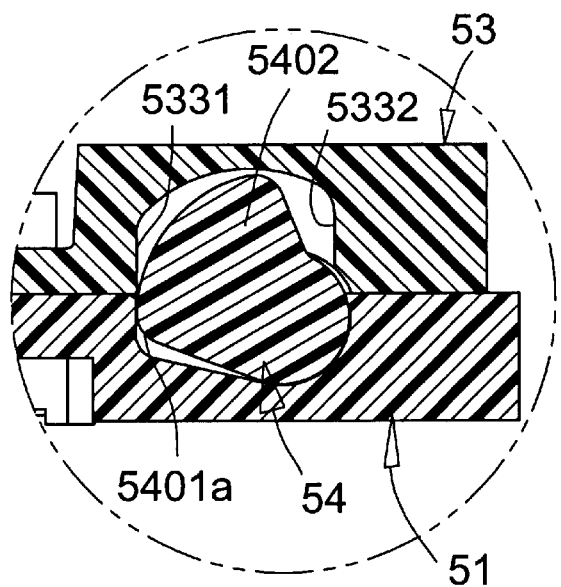
FIG. 27 is a partially sectional view taken along line 27—27 of FIG. 24.

Then, as shown in FIGS. 19 and 20, an operating piece 56 such as a flat head screwdriver is inserted into the insertion dent 541 of the driving member 54 from the perforation 534 of the second receiving section 532 of the slide cover 53. Then the operating piece 56 is shifted leftward, whereby as shown in FIGS. 22 and 23, the first cam edge 5401a of the driving member 54 is slided and detached from the locating section 5331a of the slide cover 53. At this time, the operator will apparently feel the detachment and the contact travel starts.

Figure 28:
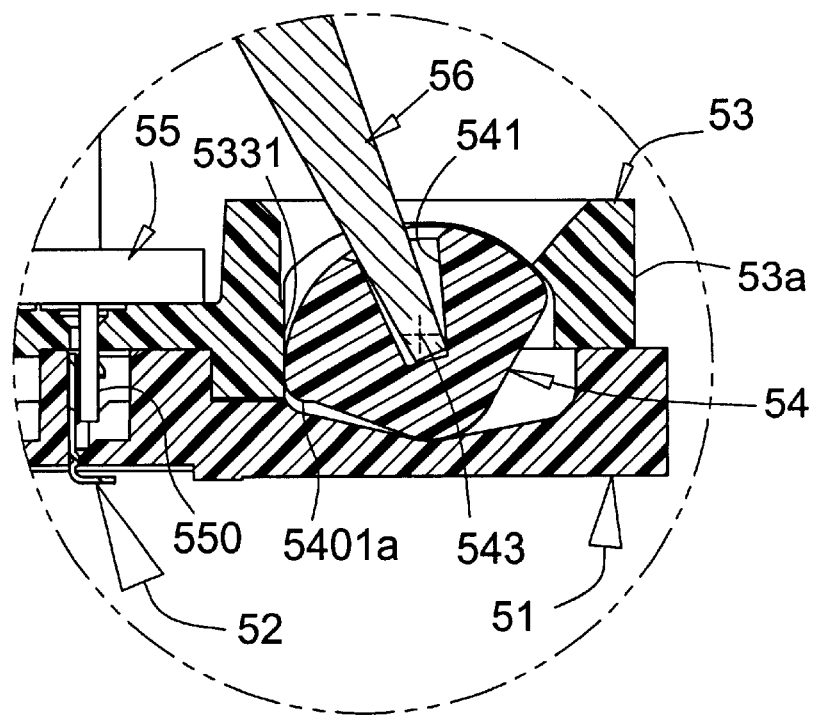
FIG. 28 is a partially sectional view taken along line 28—28 of FIG. 24.
Figure 29:
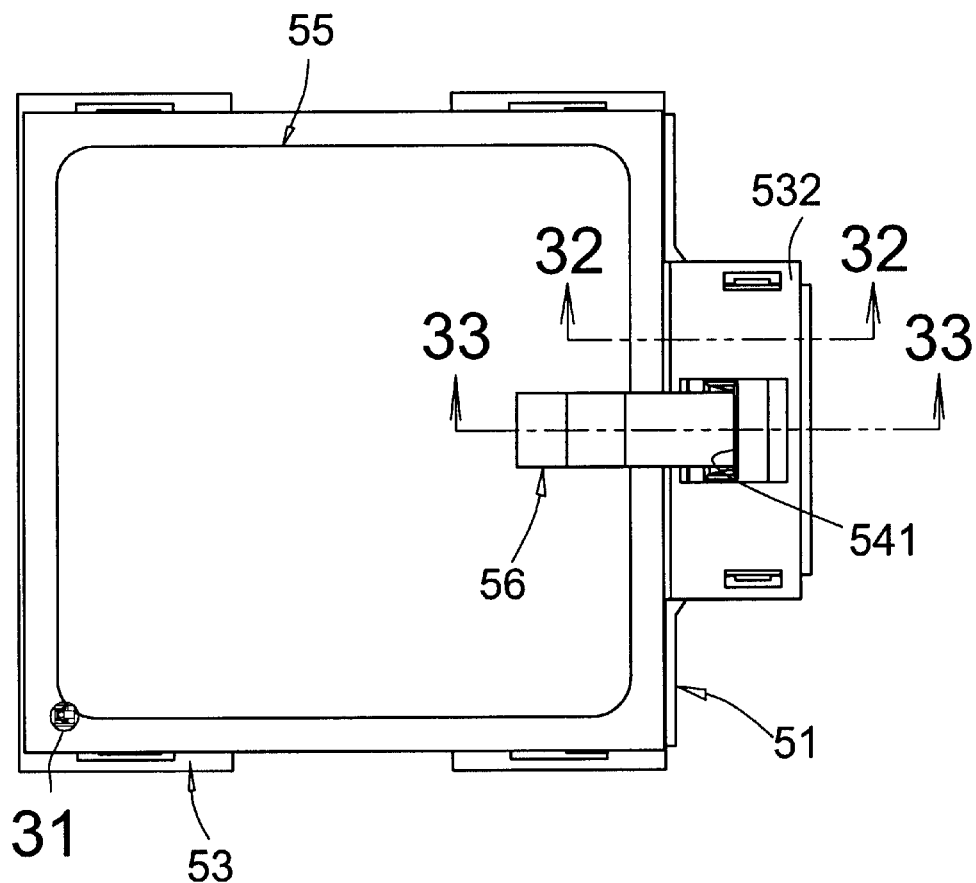
FIG. 29 is a top assembled view of the entire socket of the present invention, showing that the screwdriver is further leftward shifted to make the driving member counterclockwise rotate to the leftmost first position and stop rotating in stably latched state, whereby the insertion pins of the integrated circuit are positioned in the contact position.
Figure 30:
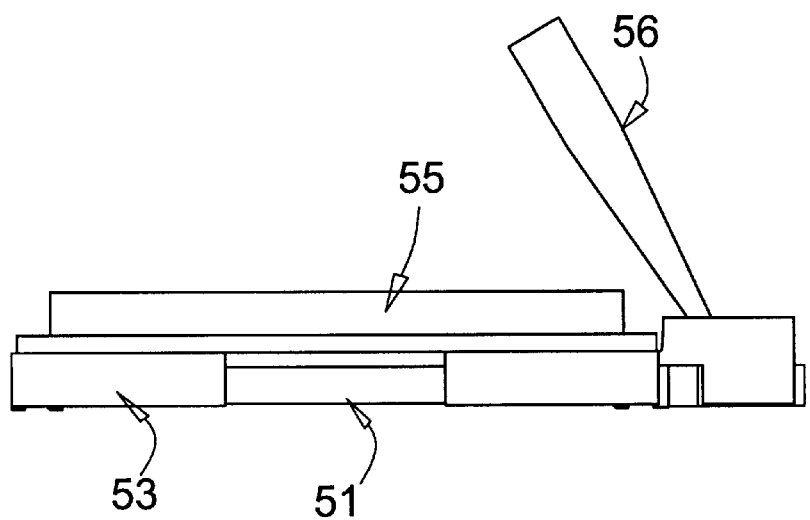
FIG. 30 is a right view of the entire socket of the present invention.
Figure 31:
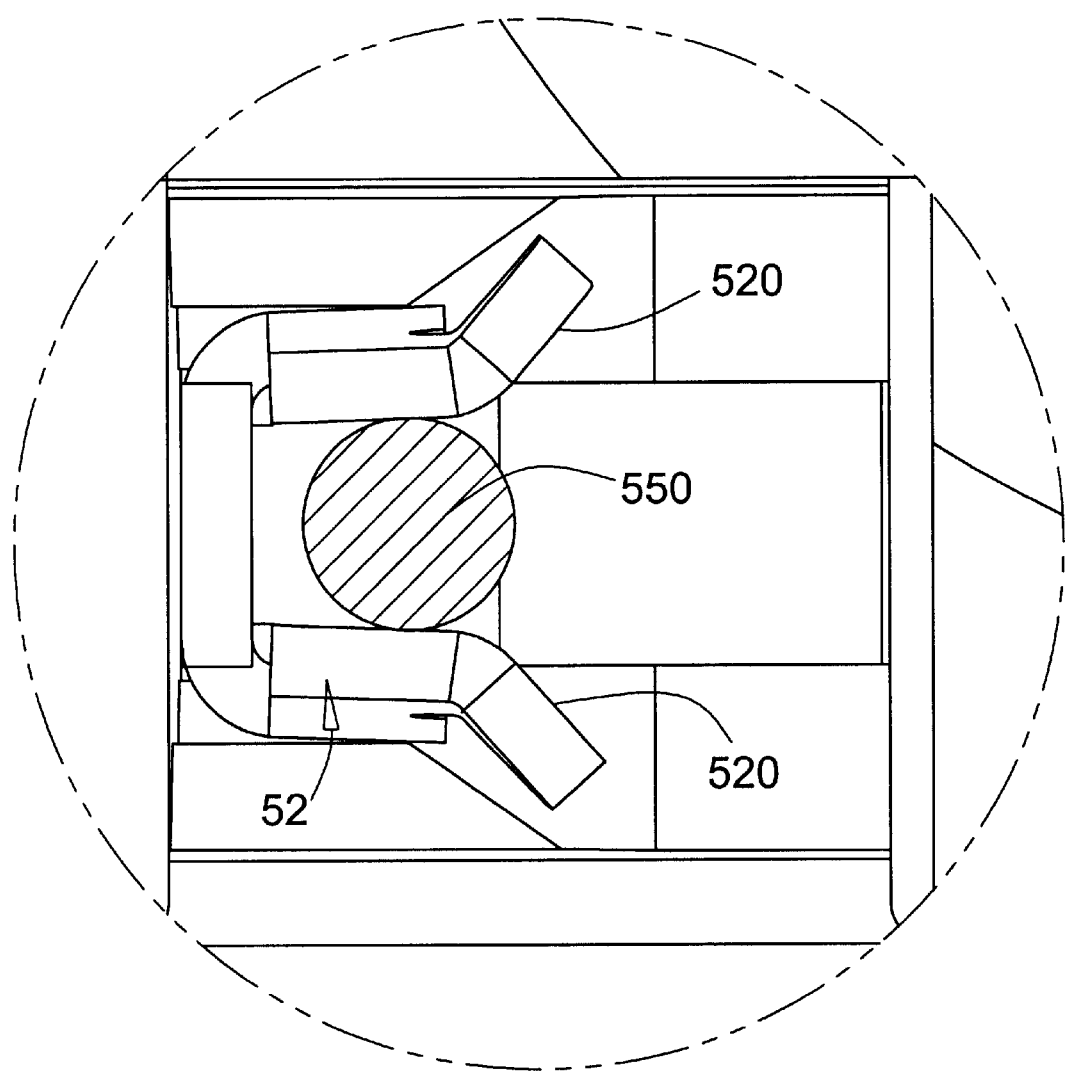
FIG. 31 is an enlarged view of circled area 31 of FIG. 29.
Figure 32:
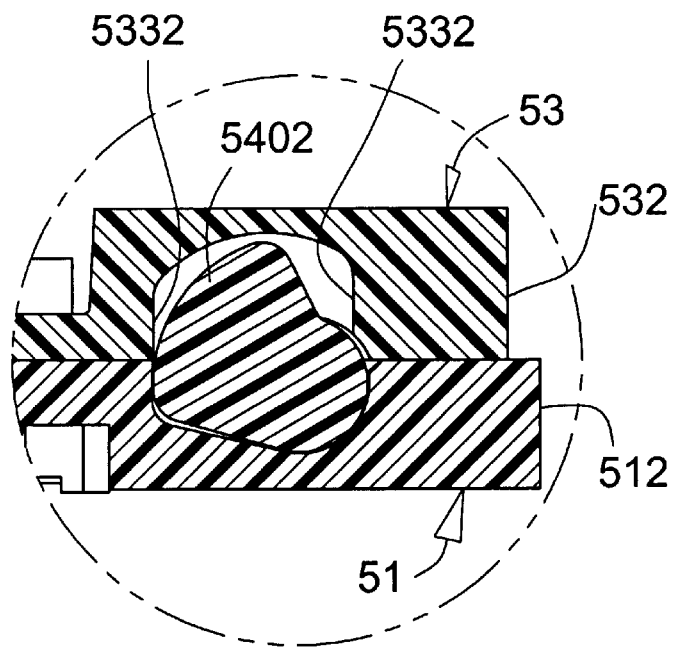
FIG. 32 is a partially sectional view taken along line 32—32 of FIG. 29.

Referring to FIGS. 24 to 28, the operating piece 56 is further leftward shifted to make the first cam edge 5401a of the driving member 54 push the first driven face 5331 of the slide cover 53, making the slide cover 53 slide leftward. When the slide cover 53 slides leftward to the contact position 53a as shown in FIG. 28, referring to FIG. 26, the insertion pins 550 of the integrated circuit 55 will slide into the gap between the two resilient sections 520 of the conductive members 52 to contact therewith and stop from further leftward sliding. The arched face 5401b is immediately next to the first cam edge 5401a. Therefore, even if the operating piece 56 is further leftward shifted, the adjoining section between the first cam edge 5401a and the arched face 5401b just contacts with the first driven face 533 of the slide cover 53 (in the contact travel ending position as shown in FIG. 28). The radia from every parts of the arched face 5401b to the second axis 543 are equal. Therefore, from the contact travel ending position as shown in FIG. 28 to the position where the first stop face 54c of the driving member 54 reaches and contacts with the receiving cavity 513 of the insulating socket 51 and ends pivotally rotating, even if the operating piece 56 is further leftward shifted, it is the arched face 5401b that contacts with the first driven face 5331 of the slide cover 53 so that the slide cover 54 will not be further pushed and slided. Accordingly, the slide cover 54 always stably keeps in the contact position and the insertion pins 550 of the integrated circuit 55 accurately optimally contact with the resilient sections 520 of the conductive members 52. In this state, the connecting line of the contact point of the first driven face 5331 of the slide cover 53 and the arched face 5401b of the driving member 54 and the second axis 543 is always parallel to the first slide connecting face 510 of the insulating socket 51. Therefore, the slide cover 54 is always stably kept in the contact position without unexpectedly displacing.

Finally, as shown in FIG. 33, when the operating piece 56 is shifted to a leftmost limit position, the first stop face 54c of the driving member 54 reaches the first position 53a and contacts with the receiving cavity 513 of the insulating socket 51 and ends pivotally rotating. After the operating piece 56 is extracted, the driving member 54 keeps in this state.

Figure 34:
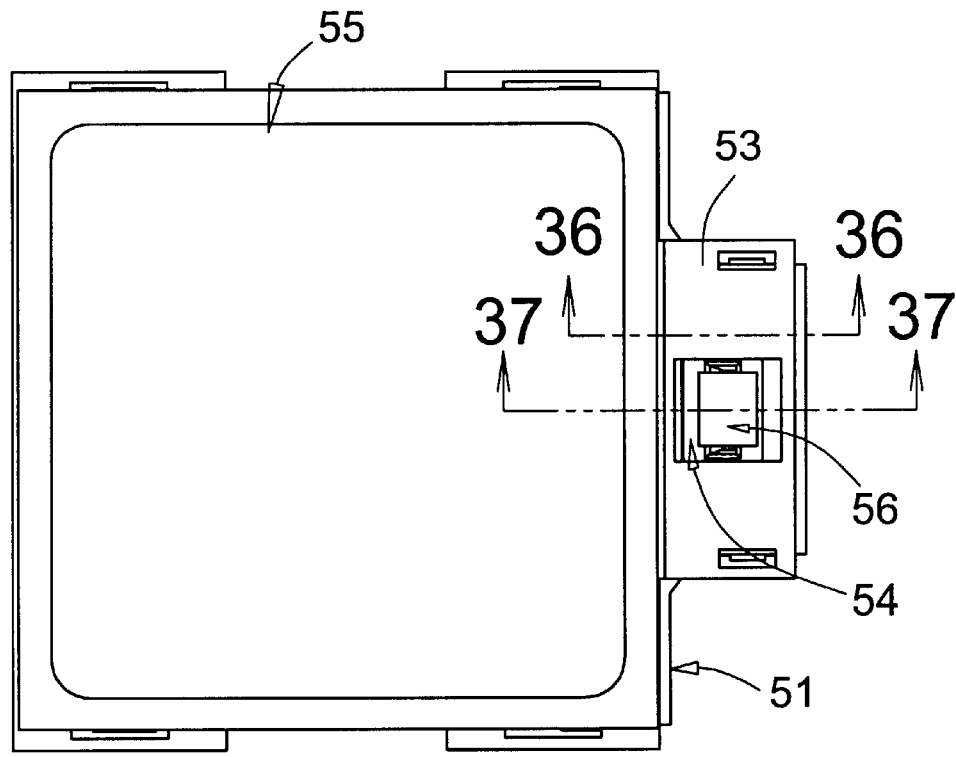
FIG. 34 is a top assembled view of the entire socket of the present invention, showing that the screwdriver starts to be rightward shifted to clockwise rotate and unlatch the driving member, whereby the slide cover is ready to slide to the rightmost separation position.
Figure 35:
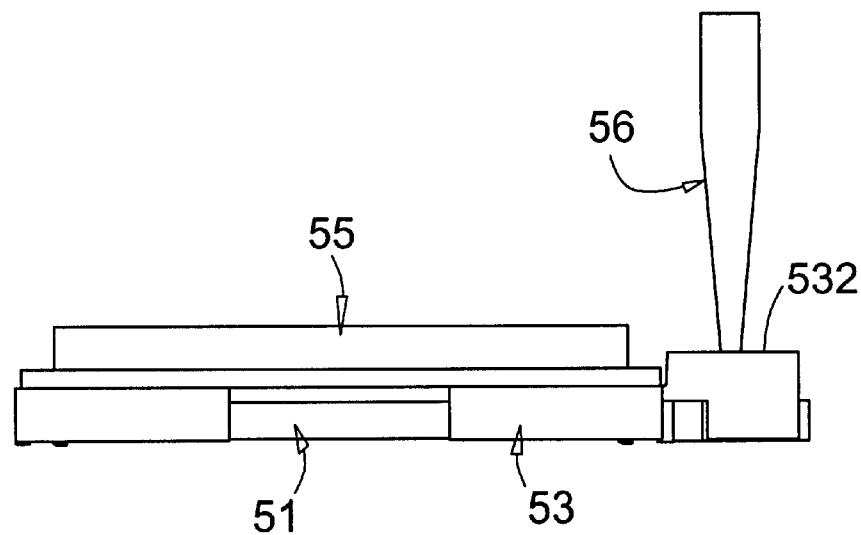
FIG. 35 is a right view of the entire socket of the present invention.
Figure 36:
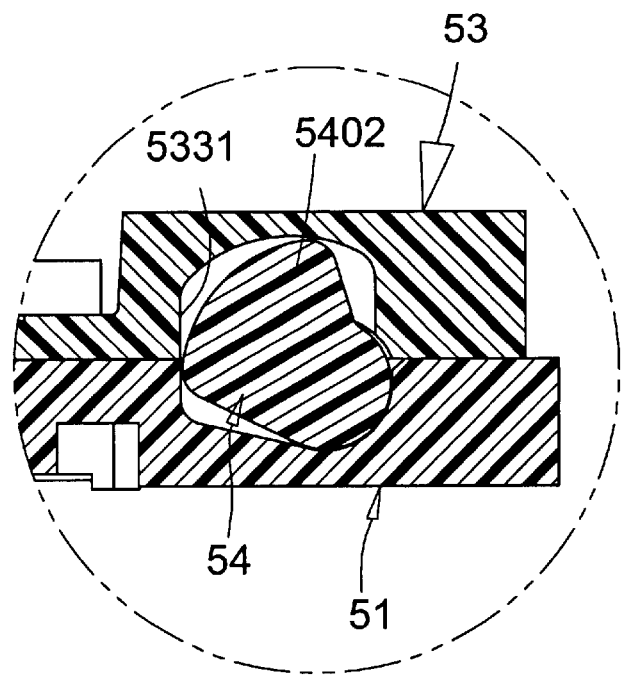
FIG. 36 is a partially sectional view taken along line 36—36 of FIG. 34.
Figure 37:
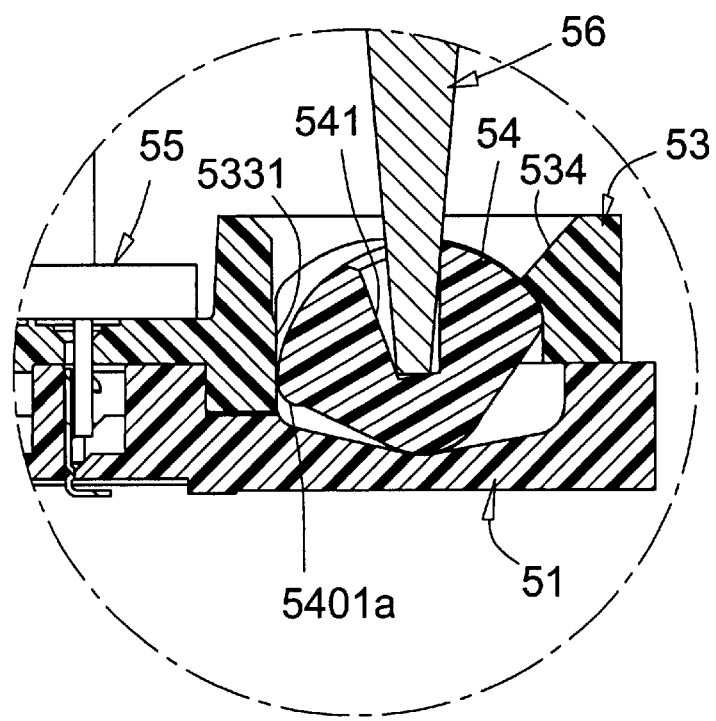
FIG. 37 is a partially sectional view taken along line 37—37 of FIG. 34.
Figure 38:
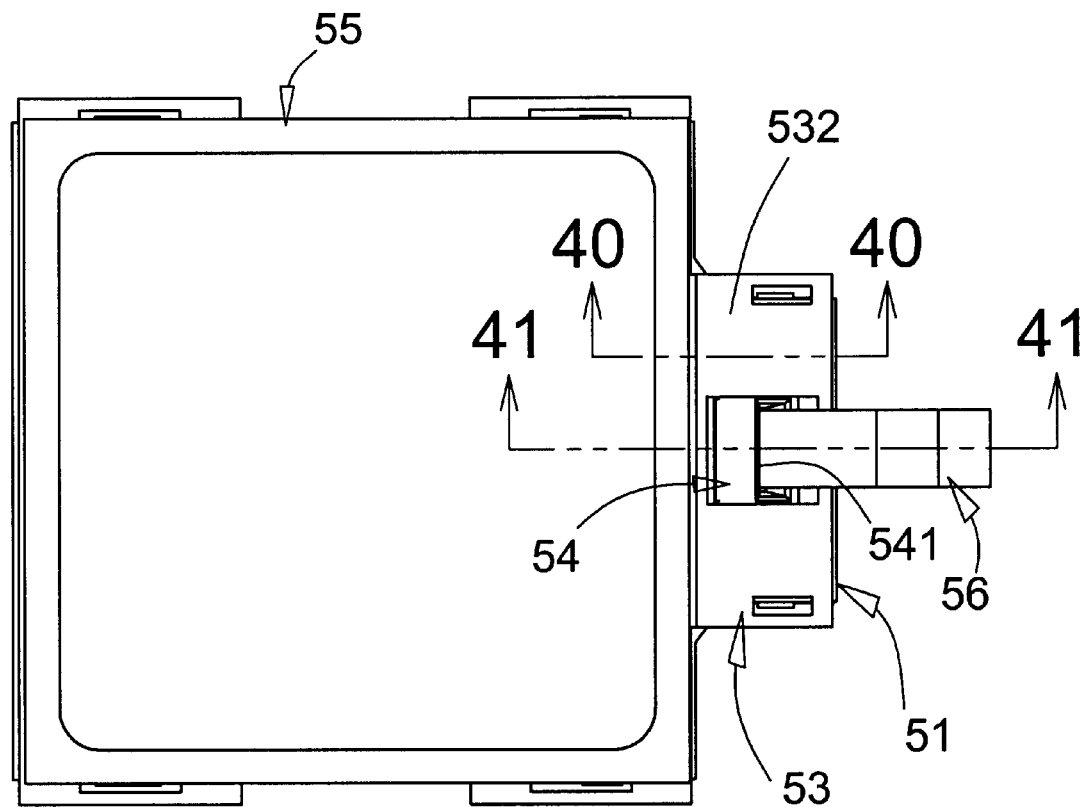
FIG. 38 is a top assembled view of the entire socket of the present invention, showing that the screwdriver is further rightward shifted to make the driving member clockwise rotate and about to reach the right second position and make the slide cover about to slide to the rightmost separation position.
Figure 39:
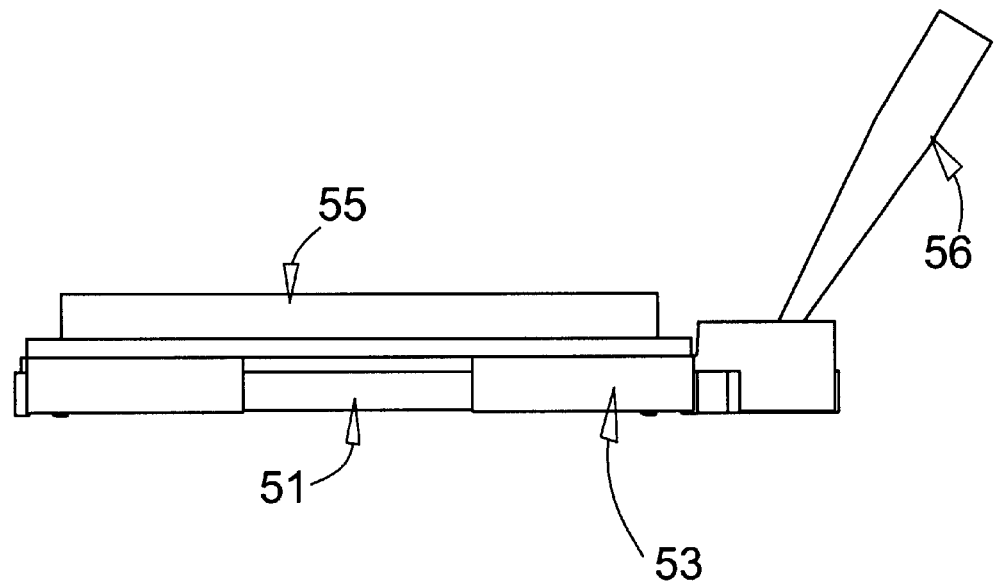
FIG. 39 is a right view of the entire socket of the present invention.

When extracting the integrated circuit 55 from the socket 50 of the present invention, as shown in FIGS. 34 and 35, an operating piece 56 such as a flat head screwdriver is inserted into the insertion dent 541 of the driving member 54 from the perforation 534 of the second receiving section 532 of the slide cover 53. Then the operating piece 56 is shifted rightward, whereby as shown in FIGS. 34, 35, 36 and 37, the driving member 54 is clockwise rotated to make the third cam edge 5401c of the first cam section 5401 first drive the third driven face 5333 of the slide cover 53 to rightward push the slide cover 53 from the contact position 53a of FIG. 33 to the separation position as a first state of separation travel.

Figure 40:
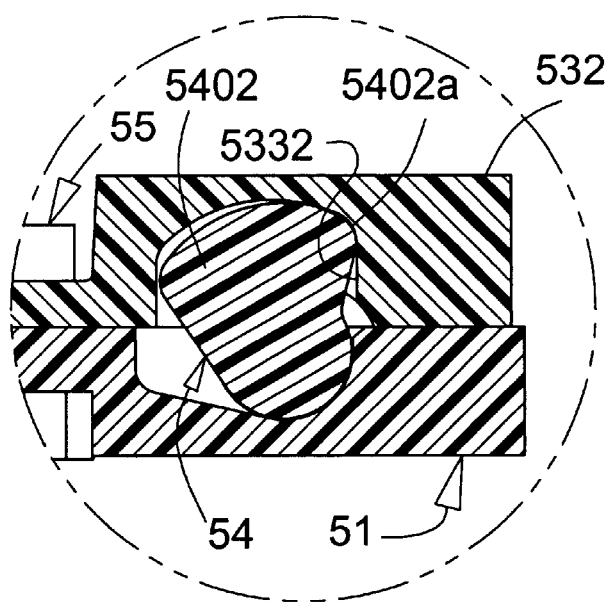
FIG. 40 is a partially sectional view taken along line 40–40 of FIG. 38.
Figure 41:
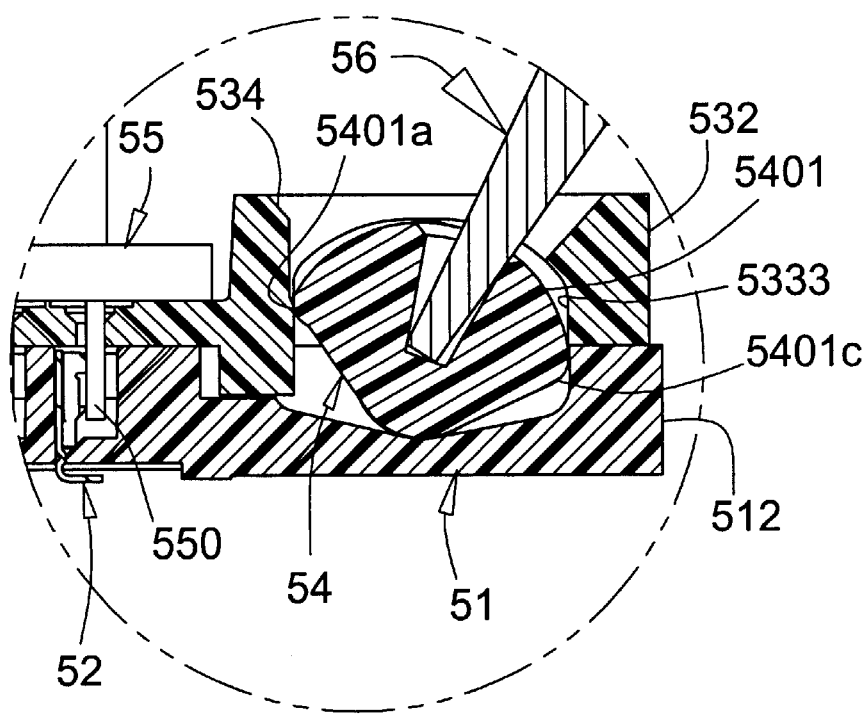
FIG. 41 is a partially sectional view taken along line 41—41 of FIG. 38.
Figure 42:
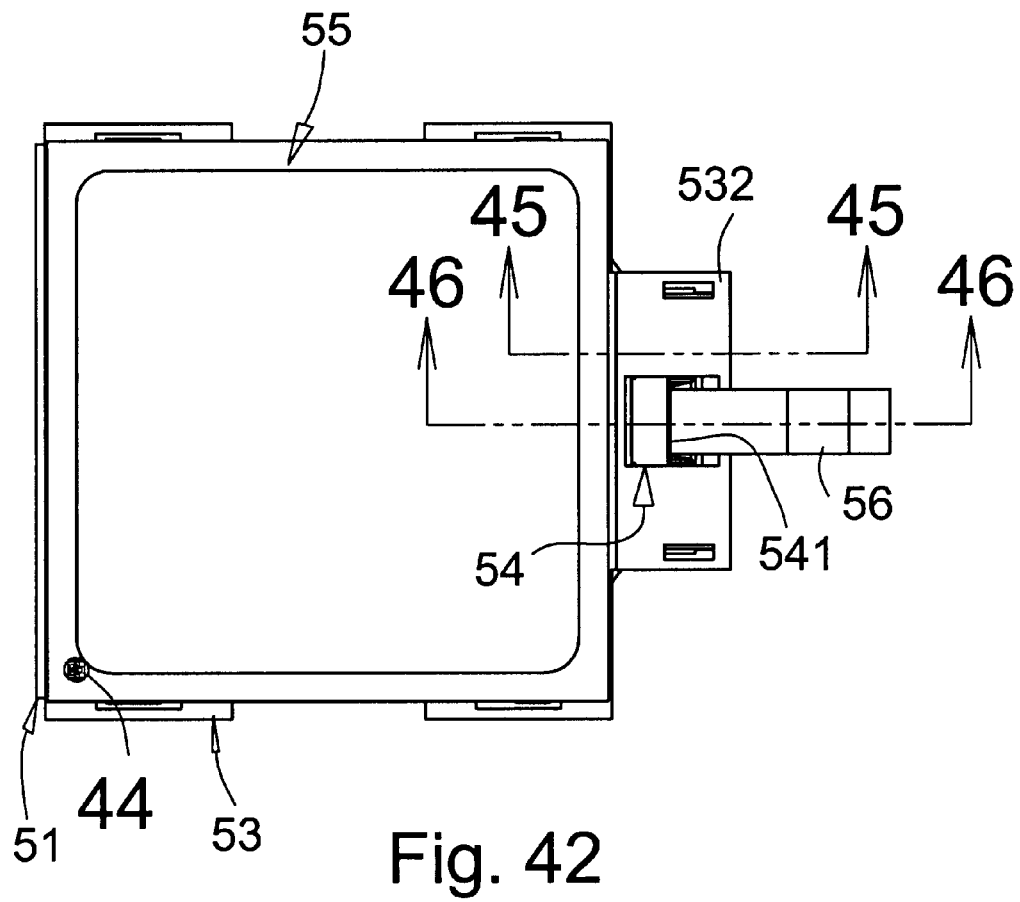
FIG. 42 is a top assembled view of the entire socket of the present invention, showing that the screwdriver is further rightward shifted to make the driving member about to reach the right second position and make the slide cover about to slide to the rightmost separation position.
Figure 43:
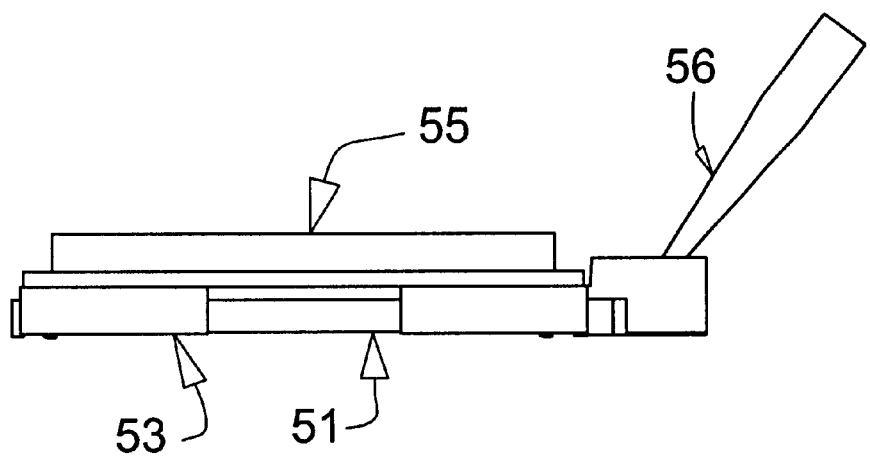
FIG. 43 is an enlarged view of circled area 43 of FIG. 42, showing that the insertion pins of the integrated circuit are positioned in the separation position and totally separated from the conductive members.

When the operating piece 56 further pushes the driving member 54, then, as shown in FIGS. 38 to 41, the third cam edge 5401c of the first cam section 5401 of the driving member 54 has already separated from the third driven face 5333 of the slide cover 53. Next, as shown in FIG. 40, the second cam edge 5402a successively drives the second driven face 5332 of the slide cover 53 to further push the slide cover 53 to the separation position as a second stage of separation travel.

Figure 44:
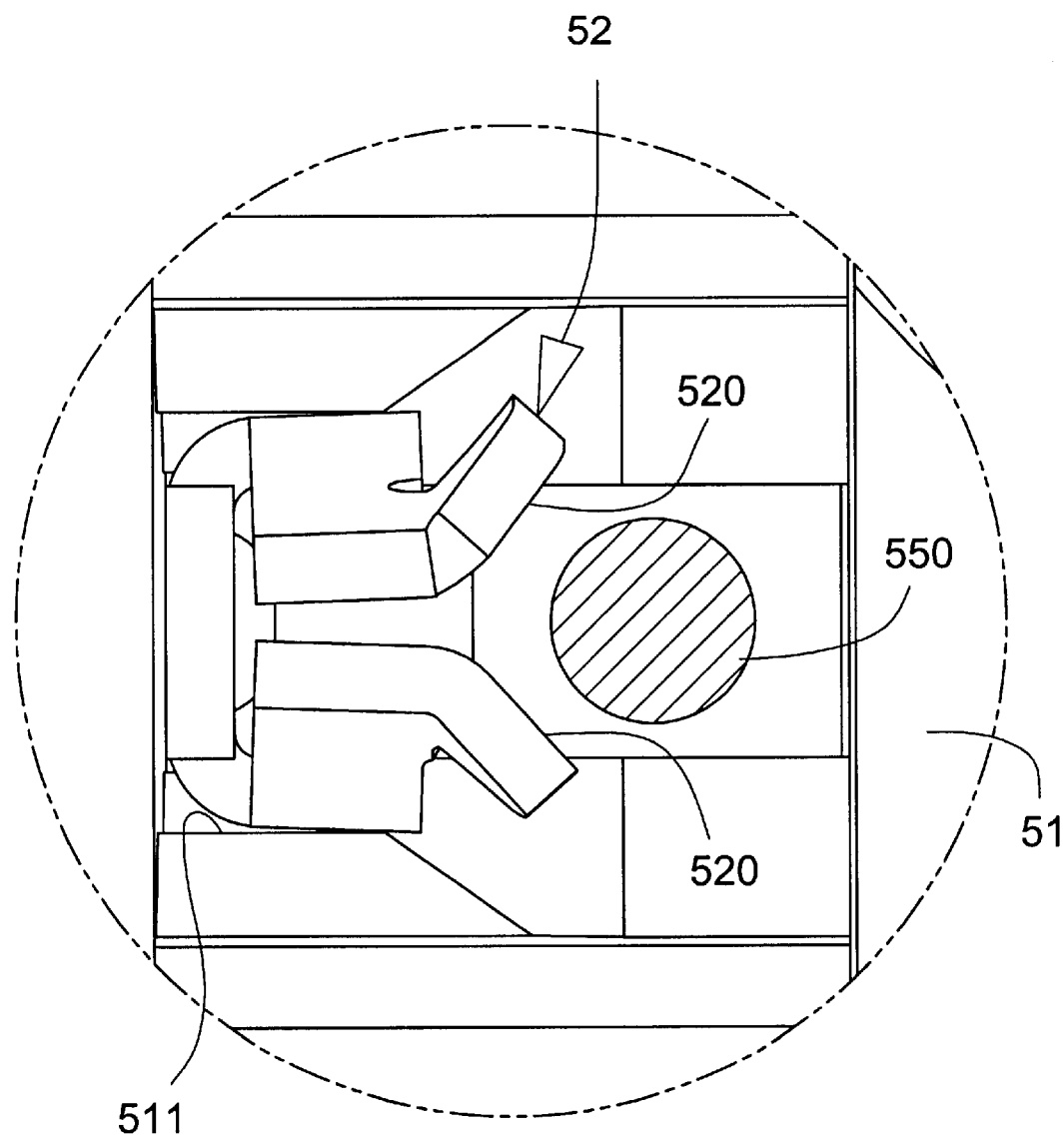
FIG. 44 is a right view of the entire socket of the present invention.
Figure 45:
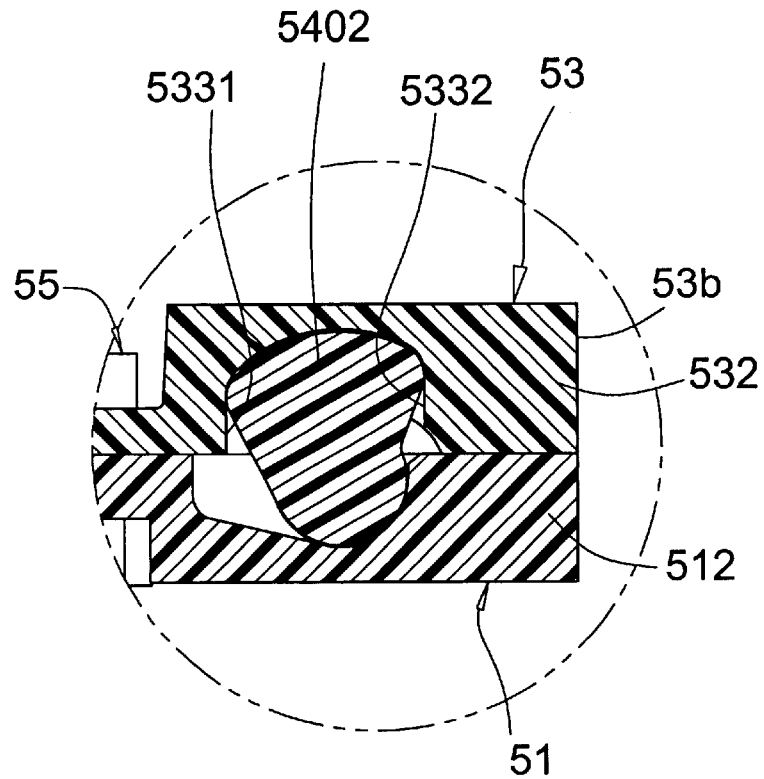
FIG. 45 is a partially sectional view taken along line 45—45 of FIG. 42.

Finally, as shown in FIGS. 42, 43, 45 and 46, the second stop face 54d of the driving member 54 reaches the second position 53b where the second stop face 54d contacts with the receiving cavity 513 of the insulating socket 51 and ends pivotally rotating. At this time, the protruding arch-shaped first cam edge 5401a is slidably latched with the locating section 5331a of the slide cover 53. The second width 545 as shown in FIG. 18 is larger than the first width 5334 so that the first cam edge 5401a can be engaged with the locating section 5331a to stably keep the driving member 54 in the second position 54b and thus stably keep the slide cover 54 in the separation position 53b. Accordingly, as shown in FIG. 44, the insertion pins 550 of the integrated circuit 55 are totally separated from the resilient sections 520 of the conductive members 52 and the integrated circuit 55 can be easily extracted from the zero insertion/extraction force integrated circuit socket 50 of the present invention for replacement or upgrade.

According to the above arrangement, the present invention has the following advantages:

1. In the first type of conventional driving structure, the operating section extends out of the socket for a user's fingers to pinch. Accordingly, a considerable operating space must be reserved beside the operating section. This makes the layout of the space quite limited and fails to meet the requirement of thinness and lightness. This problem is overcome by the zero insertion/extraction force integrated circuit socket of the present invention.

2. In the second type of conventional driving structure, the sliding distance of the slide cover can be hardly accurately controlled. As a result, the insertion pins of the CPU often fail to fully contact with the conductive members of the insulating socket or over-contact with the conductive members to damage the insertion pins and the conductive members. This problem is overcome by the zero insertion/extraction force integrated circuit socket of the present invention.

3. In the third type of conventional driving structure, it costs much strength to turn the screwdriver. This problem is overcome by the zero insertion/extraction force integrated circuit socket of the present invention.

4. By means of the zero insertion/extraction force integrated circuit socket of the present invention, a user can use a screwdriver to very easily and accurately slide the slide cover.

5. By means of the zero insertion/extraction force integrated circuit socket of the present invention, the slide cover can be stably kept in the contact position or totally close position.

6. By means of the zero insertion/extraction force integrated circuit socket of the present invention, the occupied space is reduced and the material is saved.

7. By means of the zero insertion/extraction force integrated circuit socket of the present invention, a user can feel the engagement when the slide cover reaches both the contact position and separation position. Therefore, the user can ensure that the slide cover be moved to a desired position.

The above embodiment is only used to illustrate the present invention, not intended to limit the scope thereof. Many modifications of the above embodiment can be made without departing from the spirit of the present invention.

What is claimed is:

1. A zero insertion/extraction force integrated circuit socket comprising:
   (A) an insulating socket having:
      (a) a first slide connecting face positioned on one face of the insulating socket;
      (b) multiple insertion holes arranged on the first slide connecting face and passing through the insulating socket;
      (c) a first receiving section formed on one side of the insulating socket and having a receiving dent communicating with the first slide connecting face; and
      (d) two first guiding edges respectively disposed on two opposite edges of the insulating socket, each of the guiding edges having a first latch section projecting therefrom;
   (B) multiple conductive members inserted in the insertion holes of the insulating socket one pair by one pair, the conductive members passing through the insertion holes to electrically contact with a circuit board;
   (C) a slide cover having:
      (a) a second slide connecting face positioned on one face of the slide cover to slidably contact with the first slide connecting face of the insulating socket, a direction in which the slide cover moves relative to the insulating socket being defined as sliding direction;
      multiple through holes arranged on the second slide connecting face of the slide cover and passing through the slide cover, multiple insertion pins of an integrated circuit being inserted through the through holes into the insertion holes of the insulating socket;
      (b) a second receiving section formed on one side of the slide cover, the second receiving section having a U-shaped dent communicating with the second slide connecting face and a perforation passing through the second receiving section to communicate with the U-shaped dent, the second receiving section and the first receiving section of the insulating socket being mated with each other to together form a receiving cavity; and
      (c) two second guiding edges respectively disposed on two opposite edges of the slide cover, each guiding edge having a second latch section, the second latch section being slidably latched with the first latch section of the insulating socket, whereby the first and second guiding edges and the first and second slide connecting faces together guide the slide cover to slide relative to the insulating socket; and
   (D) a driving member which is entirely hidden and pivotally disposed in the receiving cavity composed of the first receiving section of the insulating socket and the second receiving sections of the slide cover, the driving member having:
      (a) a first stop face positioned on one side of the driving member, the driving member being pivotally rotatable to a position where the first stop face contacts with the receiving dent of the insulating socket and stops, this position being defined as a first position;
      (b) a second stop face positioned on the other side of the driving member, the driving member being pivotally rotatable to a position where the second stop face contacts with the receiving dent of the insulating socket and stops, this position being defined as a second position;
      (c) a driving cam sidably contacting with the U-shaped dent of the slide cover; and
      (d) an insertion dent exposed to the perforation of the second receiving section of the slide cover, whereby an operating piece can be inserted from the perforation of the slide cover into the insertion dent of the driving member to drive the driving member, the driving cam of the driving member being pivotally rotatable to the first position to drive the slide cover, whereby the slide cover is guided to slide to a contact position where the insertion pins of the integrated circuit totally contact with the conductive members, when the driving cam of the driving member is pivotally rotated to the second position, the slide cover being driven to slide from the contact position to a separation position where the insertion pins of the integrated circuit totally separate from the conductive members.

2. The zero insertion/extraction force integrated circuit socket as claimed in claim 1, wherein the driving member is received in the receiving cavity of the insulating socket and pivotally rotatable therein, the receiving cavity having two U-shaped pivot recesses respectively formed at two ends of the receiving cavity to communicate with the first slide connecting face, a connecting line of the semicircular centers of the two U-shaped pivot recesses being defined as a first axis, the first axis being normal to said sliding direction and parallel to the first slide connecting face of the insulating socket.

3. The zero insertion/extraction force integrated circuit socket as claimed in claim 2, wherein the U-shaped dent of the slide cover has:

(a) two slide channels respectively formed at two ends of the U-shaped dent and communicate with the second slide connecting face, the two slide channels respectively corresponding to the two u-shaped pivot recesses of the insulating socket, the two slide channels and the two U-shaped pivot recesses together forming two pivot cavities at two ends of the receiving cavity;

(b) a first driven face formed on one side of the U-shaped dent of the slide cover between the U-shaped dent and the through hole; and (c) two second driven faces formed on the other side of the U-shaped dent of the slide cover respectively corresponding to two ends of the first driven face, a distance between the second driven face and the first driven face being defined as a first width.

4. The zero insertion/extraction force integrated circuit socket as claimed in claim 3, wherein the slide cover further includes a projecting section projecting from the second slide connecting face, the projecting section being positioned between the U-shaped dent and the through hole and adjacent to one side of the U-shaped dent, the first driven face extending to one lateral face of the projecting section, the other lateral face of the projecting section serving as a first stop face.

5. The zero insertion/extraction force integrated circuit socket as claimed in claim 4, wherein the insulating socket further has a dent formed on the insulating socket between the receiving cavity and the insertion hole, the dent being also adjacent to and communicating with one side of the receiving cavity, the dent communicating with the first slide connecting face and corresponding to the projecting section for receiving the projecting section, a face of the dent corresponding to the first stop face of the projecting section serving as a second stop face, whereby when the slide cover reaches the contact position, the first stop face contacts with the second stop face.

6. The zero insertion/extraction force integrated circuit socket as claimed in claim 5, wherein the driving cam of the driving member has:

(a) a first cam section having a first cam edge formed on one side of the first cam section, the first cam edge sidably contacting with the first driven face of the slide cover, whereby the first cam edge can drive the first driven face of the slide cover to make the slide cover slide to the contact position; and (b) two second cam sections formed at two ends of the first cam section, each second cam section having a second cam edge, the two second cam edges respectively simultaneously contacting with the two second driven faces of the slide cover, whereby the second cam sections can synchronously drive the two second driven faces of the slide cover to make the slide cover slide to the separation position, a maximum width between the second cam edge and the first cam edge being defined as a second width.

7. The zero insertion/extraction force integrated circuit socket as claimed in claim 6, wherein the driving member further has two pivot shafts respectively formed at two ends of the driving member and positioned at rear ends of the two second cam sections, a connecting line of the centers of the pivot shafts being defined as a second axis, the two pivot shafts being pivotally disposed in the two pivot dents composed of two U-shaped pivot recesses of the insulating socket and two slide channels of the slide cover, the second axis coinciding with the first axis of the insulating socket.

8. The zero insertion/extraction force integrated circuit socket as claimed in claim 7, wherein the first cam section further has an arched face radially positioned between the first cam edge and the insertion dent, the arched face being immediately adjacent to the first cam edge, an axis of the curvature center of the arched face coinciding with the second axis of the driving member, whereby the radia from every parts of the arched face to the second axis are equal and the radia from every parts of the arched face to the second axis are all not smaller than the radia from any part of the first cam edge to the second axis, an adjoining section between the first cam edge and the arched face just contacting with the first driven face of the slide cover in a position which is defined as a contact travel ending position, whereby when the driving member reaches the contact travel ending position, the slide cover just reaches the contact position, while the first stop face of the driving member has not yet reached the first position, whereby in the travel of the driving member from the contact travel ending position to the first position, the arched face succeeds the first cam edge to continuously contact with the first driven face of the slide cover, the radia from the arched face to the second axis being equal so that the slide cover always stably keeps in the contact position.

9. The zero insertion/extraction force integrated circuit socket as claimed in claim 8, wherein the first cam edge is formed with a protruding arched shape, the slide cover further having a locating section formed on the first driven face, the position of the locating section being a position where the first cam edge contacts with the first driven face when the driving member reaches the second position, the second width being larger than the first width, whereby the first cam edge can latch with the locating section to stably keep the driving member in the second position and thus stably keep the slide cover in the separation position.

10. The zero insertion/extraction force integrated circuit socket as claimed in claim 9, wherein the driving cam of the driving member further includes a third cam edge formed on the other side of the first cam section, the third cam edge contacting with the third driven face of the slide cover, a connecting line of the first cam edge and the second axis and a connecting line of the third cam edge and the second axis containing an angle defined as a first angle.

11. The zero insertion/extraction force integrated circuit socket as claimed in claim 10, wherein a connecting line of the first cam edge and the second axis and the connecting line of the second cam edge and the second axis contain an angle defined as a second angle, the first angle being larger than the second angle, whereby the third cam edge first drives the third driven face of the slide cover and pushes the slide cover from the contact position to the separation position as a first stage of separation travel, then the second cam edge successively driving the second driven face of the slide cover and continuously pushing the slide cover to the separation position as a second state of separation travel.

* * * * *